United States Patent
Petry et al.

(10) Patent No.: US 9,920,246 B2
(45) Date of Patent: Mar. 20, 2018

(54) PHOSPHORS

(71) Applicant: Merck Patent GmbH, Darmstadt (DE)

(72) Inventors: Ralf Petry, Griesheim (DE); Holger Winkler, Darmstadt (DE); Thomas Juestel, Witten (DE); Matthias Mueller, Muenster (DE)

(73) Assignee: Merck Patent GmbH, Darmstadt (DE)

( * ) Notice: Subject to any disclaimer, the term of this patent is extended or adjusted under 35 U.S.C. 154(b) by 167 days.

(21) Appl. No.: 14/892,796

(22) PCT Filed: Apr. 30, 2014

(86) PCT No.: PCT/EP2014/001162
§ 371 (c)(1),
(2) Date: Nov. 20, 2015

(87) PCT Pub. No.: WO2014/187530
PCT Pub. Date: Nov. 27, 2014

(65) Prior Publication Data
US 2016/0090529 A1  Mar. 31, 2016

(30) Foreign Application Priority Data
May 23, 2013 (EP) .................... 13002693

(51) Int. Cl.
| C09K 11/77 | (2006.01) |
| H05B 33/14 | (2006.01) |
| C09K 11/57 | (2006.01) |
| C09D 5/22 | (2006.01) |
| H01L 33/50 | (2010.01) |

(52) U.S. Cl.
CPC ............ *C09K 11/7792* (2013.01); *C09D 5/22* (2013.01); *C09K 11/57* (2013.01); *C09K 11/7734* (2013.01); *H01L 33/502* (2013.01)

(58) Field of Classification Search
CPC ... C09K 11/57; C09K 11/7734; H01L 33/502; H01L 33/504; C09D 5/22
See application file for complete search history.

(56) References Cited

U.S. PATENT DOCUMENTS

| 5,309,069 A | 5/1994 | Sigai |
| 6,548,172 B2 | 4/2003 | David |

(Continued)

FOREIGN PATENT DOCUMENTS

| CN | 101522861 A | 9/2009 |
| DE | 102006037730 A1 | 2/2008 |

(Continued)

OTHER PUBLICATIONS

Gaft et al, "Laser-induced time-resolved luminescence of natural margarosanite Pb(Ca,Mn)2Si3O9, swedenborgite NaBe4SbO7 and walstromite BaCa2Si3O9", European Jounal of Mineralogy, vol. 25, No. 1, Nov. 2012, pp. 71-77.*

(Continued)

*Primary Examiner* — C Melissa Koslow
(74) *Attorney, Agent, or Firm* — Millen White Zelano and Branigan, PC

(57) ABSTRACT

The present invention relates to silicate phosphors, to a process for the preparation thereof and to the use thereof as conversion phosphors. The present invention also relates to an emission-converting material comprising at least the conversion phosphor according to the invention, and to the use thereof in light sources, in particular pc-LEDs (phosphor converted light emitting devices). The present invention furthermore relates to light sources, in particular pc-LEDs, and to lighting units which comprise a primary light source and the emission-converting material according to the invention.

18 Claims, 11 Drawing Sheets

(56) References Cited

U.S. PATENT DOCUMENTS

| | | |
|---|---|---|
| 8,256,920 B2 | 9/2012 | Winkler et al. |
| 8,801,968 B2 | 8/2014 | Petry et al. |
| 9,139,763 B2 | 9/2015 | Winkler |
| 2010/0187976 A1 | 7/2010 | Winkler |
| 2010/0309647 A1 | 12/2010 | Winkler et al. |
| 2011/0090683 A1 | 4/2011 | Petry et al. |
| 2011/0304264 A1 | 12/2011 | Winkler |

FOREIGN PATENT DOCUMENTS

| | | |
|---|---|---|
| DE | 102007022566 A1 | 11/2008 |
| DE | 102007056342 A1 | 5/2009 |
| JP | 04304290 A | 10/1992 |
| WO | 9110715 A1 | 7/1991 |
| WO | 9927033 A1 | 6/1999 |
| WO | 2009065480 A1 | 5/2009 |
| WO | 2010075908 A1 | 7/2010 |

OTHER PUBLICATIONS

Yao et al, "Preparation and luminescenct properties of BaCa2Si3O9:Eu2+", Optics & laser Technology, 43, Apr. 2011, pp. 1282-1285.*

International Search Report dated Jul. 8, 2014 issued in corresponding PCT/EP2014/001162 application (pp. 1-3).

S. Yao et al., "Preparation and Luminescent Properties of BaCa2Si3O9:Eu2+", Optics & Laser Technology, vol. 43, No. 7 (2011) pp. 1282-1285.

K. Park et al., "Temperature and Excitation Power-Resistant White-Light Emission of the T-Phase (Ba, Ca)2SiO4:Eu2+, Mn2+ Phosphor", Solid State Communications, vol. 150, No. 7-8 (2010) pp. 329-332.

J.H. Yu et al., "Low-Voltage, Simple-Structure, High-Efficiency p-i-n-Type Electrophosphorescent Blue Organic Light-Emitting Diodes", Japanese Journal of Applied Physics, vol. 49, No. 10 (2010) pp. 102102-1-102102-4.

Chinese Office Action dated Dec. 9, 2016 issued in corresponding CN 201480029157.5 application w/English Translation.

English Abstract of CN 101522861 A published Sep. 2, 2009.

H.J Lee et al., "Optical Properties of Blue-Light-Emitting (Ca,Sr)Mg2Si3O9:Eu2+ Phosphor", Japanese Journal of Applied Physics, vol. 49 (2010) p. 102101.

M. Gaft et al., "Laser-Induced Time-Resolved Luminescence of Natural Margarosanite Pb(Ca,Mn)2Si3O9, Swedenborgite NaBe4SbO7 and Walstromite BaCa2Si3O9", European Journal of Mineralogy, vol. 25, No. 1 (2012) pp. 71-77.

C.K. Chang et al., "White Light Generation Under Violet-Blue Excitation From Tunable Green-To-Red Emitting Ca2MgSi2O7: Eu, Mn Through Energy Transfer", Applied Physics Letters, vol. 90 (2007) p. 161901.

J.S. Kim et al., "Luminescent and Thermal Properties of Full-Color Emitting X3MgSi2O8:Eu2+, Mn2+ (X=Ba, Sr, Ca) Phosphors for White LED", Journal of Luminescence, vol. 122-123 (2007) pp. 583-586.

\* cited by examiner

PHOSPHORS

The present invention relates to silicate phosphors, to a process for the preparation thereof and to the use thereof as conversion phosphors. The present invention also relates to an emission-converting material comprising the conversion phosphor according to the invention and to the use thereof in light sources, in particular pc-LEDs (phosphor converted light emitting devices). The present invention furthermore relates to light sources, in particular pc-LEDs, and to lighting units which comprise a primary light source and the emission-converting material according to the invention.

For more than 100 years, inorganic phosphors have been developed in order to adapt the spectra of emissive display screens, X-ray amplifiers and radiation or light sources in such a way that they meet the requirements of the respective area of application in as optimal a manner as possible and at the same time consume as little energy as possible. The type of excitation, i.e. the nature of the primary radiation source and the requisite emission spectrum, is of crucial importance here for the choice of host lattice and the activators.

In particular for fluorescent light sources for general lighting, i.e. low-pressure discharge lamps and light-emitting diodes, novel phosphors are constantly being developed in order further to increase the energy efficiency, colour reproduction and stability.

There are in principle three different approaches to obtaining white-emitting inorganic LEDs (light emitting diodes) by additive colour mixing:

(1) RGB LEDs (red+green+blue LEDs), in which white light is generated by mixing the light from three different light-emitting diodes which emit in the red, green and blue spectral region.

(2) Complementary systems, in which an emitting semiconductor (primary light source) emits, for example, blue light, which excites one or more phosphors (conversion phosphors) which emit light, for example in the yellow region. By mixing the blue and yellow light, white light is then produced. Alternatively, it is possible to use two or more phosphors which emit, for example, green or yellow and orange or red light.

(3) UV-LED+RGB phosphor, in which a semiconductor which emits in the UV region (primary light source) emits light to the environment in which three different conversion phosphors are excited to emit in the red, green and blue spectral region. Alternatively, it is possible to use two different phosphors which emit yellow or orange and blue.

Binary complementary systems have the advantage that they are capable of producing white light with only one primary light source and—in the simplest case—with only one conversion phosphor. The best-known of these systems consists of an indium aluminium gallium nitride chip as primary light source, which emits light in the blue spectral region, and a cerium-doped yttrium aluminium garnet (YAG:Ce) as conversion phosphor, which is excited in the blue region and emits light in the yellow spectral region. Indium gallium nitride LEDs have a long lifetime, small physical depth and a high internal and external quantum yield. The main advantage in the use of a blue primary radiation source, such as indium gallium nitride LEDs or $In^{3+}$ gas discharges, lies in the low Stokes loss on conversion into white light. However, the use of blue-emitting indium gallium nitride LEDs also results in a number of difficulties, such as the strong dependence of the colour point on the thickness of the phosphor layer, the strong spectral interaction between the luminophores owing to the small Stokes shift, and a restricted choice of luminophores, since many activators or phosphors do not absorb sufficiently strongly in the blue spectral region.

These difficulties can be circumvented by the use of indium gallium nitride semiconductors which emit in the near-UV. In particular, the emission range between 370 and 420 nm is of interest, since the Stokes loss here on conversion into a white spectrum is not yet too great. In addition, semiconductors have a fairly high external quantum yield of the electroluminescence in this spectral region, meaning that the so-called "wall-plug efficiency" of an LED based thereon is also fairly high.

Accordingly, near-UV LEDs as the basis for white-emitting LEDs are the focus of a number of developments of LED light sources, and the research and development of novel conversion phosphors for UV-LEDs has been intensified in recent years. For this reason, inorganic fluorescent powders which can be excited in the near-UV region of the spectrum are also, in particular, increasing more and more in importance today as conversion phosphors for light sources, in particular for pc-LEDs.

It is an object of the present invention to provide novel compounds which can be excited in the near-UV region. A further object of the present invention is the provision of phosphors which have a plurality of emission maxima, meaning that fewer different phosphors are necessary for the generation of white light on excitation in the UV region.

Surprisingly, it has been found that the silicate phosphors described below achieve this object. These phosphors can be excited in the near-UV region and exhibit emission both in the blue and also in the red spectral region.

The present invention therefore relates to a compound of the following formula (1), $$(EA^1)_{1-x}(EA^2)_{2-y}Si_3O_9:Eu_x,Mn_y \qquad (1)$$

where the following applies to the symbols and indices used:
EA$^1$ is Ba or a mixture of Ba and Sr which comprises up to 20 atom-% of Sr;
EA$^2$ is selected from the group consisting of Ca or Sr or mixtures of these elements, where up to 20 atom-% of these elements may be replaced by Mg;
$0.01 \leq x \leq 0.25$;
$0.01 < y \leq 0.20$.

The compounds according to the invention can be excited in the near-UV spectral region, preferably at about 370-420 nm, and usually exhibit emission maxima in the blue and in the orange or red spectral region, so that the resultant emission colour can be described as magenta.

In the context of this application, blue light denotes light whose emission maximum is between 400 and 459 nm, cyan-coloured light denotes light whose emission maximum is between 460 and 505 nm, green light denotes light whose emission maximum is between 506 and 545 nm, yellow light denotes light whose emission maximum is between 546 and 565 nm, orange light denotes light whose emission maximum is between 566 and 600 nm and red light denotes light whose emission maximum is between 601 and 670 nm.

In a preferred embodiment of the invention, EA$^1$ is selected from Ba or a mixture of Ba and Sr which comprises a maximum of 10 atom-% of Sr. EA$^1$ particularly preferably stands for Ba.

In a further preferred embodiment of the invention, EA$^2$ is selected from Ca or Sr or a mixture of Ca and Sr or a mixture of Ca and Mg which comprises a maximum of 20 atom-% of Mg or a mixture of Sr and Mg which comprises a maximum of 20 atom-% of Mg.

A preferred embodiment of the compounds of the formula (1) is therefore the compounds of the following formulae (2) to (4), $$(Ba_{1-z}Sr_z)_{1-x}(Ca_{1-w}Sr_w)_{2-y}Si_3O_9:Eu_x,Mn_y \quad (2)$$

$$(Ba_{1-z}Sr_z)_{1-x}(Ca_{1-v}Mg_v)_{2-y}Si_3O_9:Eu_x,Mn_y \quad (3)$$

$$(Ba_{1-z}Sr_z)_{1-x}(Sr_{1-v}Mg_v)_{2-y}Si_3O_9:Eu_x,Mn_y \quad (4)$$

where the indices x and y have the meanings given above and the following applies to the other indices used:
$0 \leq z \leq 0.20$;
$0 \leq w \leq 1$;
$0 \leq v \leq 0.20$.

In a preferred embodiment of the invention, $0 \leq z \leq 0.10$. In a further preferred embodiment of the invention, $0 \leq w \leq 0.10$. In still a further embodiment of the invention, $0 \leq v \leq 0.10$. These preferences preferably occur simultaneously, so that the following preferably applies: $0 \leq z \leq 0.10$ and simultaneously $0 \leq w \leq 0.10$, or the following applies: $0 \leq z \leq 0.10$ and simultaneously $0 \leq v \leq 0.10$.

Particularly preferred embodiments of the compounds of the formulae (2), (3) and (4) are the compounds of the following formulae (2a) to (2c), (3a) and (4a), $$Ba_{1-x}Ca_{2-y}Si_3O_9:Eu_x,Mn_y \quad (2a)$$

$$Ba_{1-x}Sr_{2-y}Si_3O_9:Eu_x,Mn_y \quad (2b)$$

$$Ba_{1-x}(Ca_{1-w}Sr_w)_{2-y}Si_3O_9:Eu_x,Mn_y \quad (2c)$$

$$Ba_{1-x}(Ca_{1-v}Mg_v)_{2-y}Si_3O_9:Eu_x,Mn_y \quad (3a)$$

$$Ba_{1-x}(Sr_{1-v}Mg_v)_{2-y}Si_3O_9:Eu_x,Mn_y \quad (4a)$$

where the indices used have the meanings given above.

In a preferred embodiment of the invention, the following applies to the index x in the compounds of the formulae (1) to (4) and the preferred embodiments indicated above: $0.05 \leq x \leq 0.15$.

In a further preferred embodiment of the invention, the following applies to the index y in the compounds of the formulae (1) to (4) and the preferred embodiments indicated above: $0.05 \leq y \leq 0.15$.

In a particularly preferred embodiment of the invention, the preferences given above apply simultaneously.

The present invention furthermore relates to a process for the preparation of a compound of the formula (1) or the preferred embodiments, comprising the steps:
a) preparation of a mixture comprising $EA^1$, $EA^2$, Eu, Mn and Si; and
b) calcination of the mixture at elevated temperature.

The ions $EA^1$ and $EA^2$ here are preferably employed in the form of the corresponding carbonates, oxides or oxalates. Preference is given to the use of carbonates.

Preference is furthermore given to the use of Eu in the form of the oxide $Eu_2O_3$.

Preference is furthermore given to the use of Mn in the form of the oxalate, in particular as hydrate $MnC_2O_4 \cdot 2H_2O$. Alternatively, Mn can also be employed in the form of the carbonate $MnCO_3$.

Preference is furthermore given to the use of Si in the form of the oxide $SiO_2$. This is amorphous $SiO_2$, preferably in the form of microparticles or more preferably in the form of nanoparticles.

The ratio of $EA^1$, $EA^2$, Eu, Mn and Si in the mixture in step a) of the process according to the invention arises from the desired stoichiometry of the reaction product, i.e. the starting materials are employed in accordance with the desired ratio in the product.

The mixture in step a) is preferably prepared in a mortar, preferably in a solvent. The solvent employed is preferably acetone or an alcohol, in particular ethanol, propanol or isopropanol. On an industrial scale, the mixture in step a) is preferably prepared in an automatic mortar mill.

The mixture is dried before the calcination. This is preferably carried out in air, initially at room temperature and then in a drying cabinet at elevated temperature, preferably at 60-120° C., in particular at about 80° C.

It may be preferred here to add a fluxing agent to the mixture. Suitable fluxing agents are, for example, boric acid $H_3BO_3$, ammonium fluoride $NH_4F$, barium fluoride $BaF_2$ or calcium fluoride $CaF_2$. Preference is given to boric acid. Residues of the fluxing agent may also remain in the product.

The calcination of the mixture in step b) of the process according to the invention is preferably carried out under reducing or at least under non-oxidising conditions. Preference is given here to a reaction time of 5 to 24 h, particularly preferably 8 to 16 h, and a temperature in the range from 1100 to 1300° C., particularly preferably from 1200 to 1250° C.

The non-oxidising or reducing conditions are established here, for example, using inert gases or carbon monoxide, forming gas or hydrogen or vacuum or an oxygen-deficient atmosphere. Preference is given to a forming-gas atmosphere, in particular having a content of 5 to 10% by vol. of $H_2$ in $N_2$.

The calcination can be carried out, for example, by introducing the resultant mixtures into a high-temperature furnace in a boron nitride or corundum vessel. The high-temperature furnace is in a preferred embodiment a tubular furnace.

It is preferred for the compounds according to the invention to be comminuted, for example by grinding in a mortar, after the calcination step.

The average particle size $d_{50}$ of the volume distribution of the phosphors according to the invention for use in LEDs is usually between 50 nm and 30 μm, preferably between 1 μm and 20 μm. The particle size here is preferably determined by means of a Coulter counter measurement.

In still a further embodiment, the compounds according to the invention may be coated. Suitable for this purpose are all coating methods as are known to the person skilled in the art from the prior art and are used for phosphors. Suitable materials for the coating are, in particular, metal oxides and nitrides, in particular alkaline-earth metal oxides, such as $Al_2O_3$, and alkaline-earth metal nitrides, such as AlN, as well as $SiO_2$. The coating can be carried out here, for example, by fluidised-bed methods or by wet-chemical methods. Suitable coating methods are disclosed, for example, in JP 04-304290, WO 91/10715, WO 99/27033, US 2007/0298250, WO 2009/065480 and WO 2010/075908. The aim of the coating can on the one hand be higher stability of the phosphors, for example to air or moisture. However, the aim may also be improved coupling-in and -out of light through a suitable choice of the surface of the coating and the refractive indices of the coating material. As an alternative or in addition to an inorganic coating, the compounds may also be coated with organic materials, for example with siloxanes. This may have advantages with respect to the dispersibility in a resin during production of the LEDs.

The present invention again furthermore relates to the use of the compound according to the invention as phosphor or conversion phosphor, in particular for the partial or complete conversion of the near-UV emission of a light-emitting diode into light having a longer wavelength.

The compounds according to the invention are also called phosphors below.

The present invention therefore furthermore relates to an emission-converting material comprising a compound according to the invention. The emission-converting material may consist of the compound according to the invention and would in this case be equivalent to the term "conversion phosphor" defined above. It may also be preferred for the emission-converting material according to the invention also to comprise further conversion phosphors besides the compound according to the invention. In this case, the emission-converting material according to the invention preferably comprises a mixture of at least two conversion phosphors, where at least one thereof is a compound according to the invention. It is particularly preferred for the at least two conversion phosphors to be phosphors which emit light of wavelengths which are complementary to one another.

The compounds according to the invention give rise to good LED qualities. The LED quality is described here via conventional parameters, such as, for example, the colour rendering index (CRI), the correlated colour temperature (CCT), lumen equivalent or absolute lumen, or the colour point in CIE x and y coordinates.

The colour rendering index (CRI) is a dimensionless lighting quantity, familiar to the person skilled in the art, which compares the colour reproduction faithfulness of an artificial light source with that of sunlight or filament light sources (the latter two have a CRI of 100).

The correlated colour temperature (CCT) is a lighting quantity, familiar to the person skilled in the art, with the unit kelvin. The higher the numerical value, the higher the blue content of the light and the colder the white light from an artificial radiation source appears to the observer. The CCT follows the concept of the black body radiator, whose colour temperature describes the so-called Planck curve in the CIE diagram.

The lumen equivalent is a lighting quantity, familiar to the person skilled in the art, with the unit lm/W which describes the magnitude of the photometric luminous flux in lumens of a light source at a certain radiometric radiation power with the unit watt. The higher the lumen equivalent, the more efficient a light source.

The lumen is a photometric lighting quantity, familiar to the person skilled in the art, which describes the luminous flux of a light source, which is a measure of the total visible radiation emitted by a radiation source. The greater the luminous flux, the brighter the light source appears to the observer.

CIE x and CIE y stand for the coordinates in the standard CIE colour chart (here standard observer 1931), familiar to the person skilled in the art, by means of which the colour of a light source is described.

All the quantities mentioned above can be calculated from the emission spectra of the light source by methods familiar to the person skilled in the art.

The excitability of the phosphors according to the invention extends over a broad range, which extends from about 250 nm to 420 nm, preferably 350 nm to about 420 nm. The maximum of the excitation curve of the phosphors according to the invention is usually at about 350 nm.

The present invention furthermore relates to a light source which comprises at least one primary light source and at least one compound according to the invention. The emission maximum of the primary light source here is usually in the range 350 nm to 420 nm, preferably 370 nm to about 420 nm, where the primary radiation is converted partly or fully into longer-wave radiation by the phosphor according to the invention.

In a preferred embodiment of the light source according to the invention, the primary light source is a luminescent indium aluminium gallium nitride, in particular of the formula $In_iGa_jAl_kN$, where $0 \leq i$, $0 \leq j$, $0 \leq k$, and $i+j+k=1$.

Possible forms of light sources of this type are known to the person skilled in the art. These can be light-emitting LED chips of various structure.

In a further preferred embodiment of the light source according to the invention, the primary light source is a luminescent arrangement based on ZnO, TCO (transparent conducting oxide) or SiC.

In a further preferred embodiment of the light source according to the invention, the primary light source is a source which exhibits electroluminescence and/or photoluminescence. The primary light source may furthermore also be a plasma or discharge source.

Corresponding light sources according to the invention are also known as light-emitting diodes or LEDs.

The phosphors according to the invention can be employed individually or as a mixture with the following phosphors, which are familiar to the person skilled in the art. Since the phosphors according to the invention exhibit emission in the blue and red spectral region, they are particularly preferably employed in combination with one or more phosphors which emit in the yellow or green spectral region.

Corresponding phosphors which are in principle suitable for mixtures are, for example: $Ba_2SiO_4:Eu^{2+}$, $BaSi_2O_5:Pb^{2+}$, $Ba_xSr_{1-x}F_2:Eu^{2+}$, $BaSrMgSi_2O_7:Eu^{2+}$, $BaTiP_2O_7$, $(Ba,Ti)_2P_2O_7:Ti$, $Ba_3WO_6:U$, $BaY_2F_8:Er^{3+},Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+},Mn^{2+}$, $CaAl_2O_4:Tb^{3+}$, $Ca_3Al_2Si_3O_{12}:Ce^{3+}$, $Ca_3Al_2Si_3Oi_2:Ce^{3+}$, $Ca_3Al_2Si_3O_2:Eu^{2+}$, $Ca_2B_5O_9Br:Eu^{2+}$, $Ca_2B_5O_9Cl:Eu^{2+}$, $Ca_2B_5O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+},Mn^{2+}$, $Ca_2Ba_3(PO_4)_3Cl:Eu^{2+}$, $CaCl_2:Eu^{2+},Mn^{2+}$ in $SiO_2$, $CaF_2:Ce^{3+}$, $CaF_2:Ce^{3+},Mn^{2+}$, $CaF_2:Ce^{3+},Tb^{3+}$, $CaF_2:Eu^{2+}$, $CaF_2:Mn^{2+}$, $CaGa_2O_4:Mn^{2+}$, $CaGa_4O_7:Mn^{2+}$, $CaGa_2S_4:Ce^{3+}$, $CaGa_2S_4:Eu^{2+}$, $CaGa_2S_4:Mn^{2+}$, $CaGa_2S_4:Pb^{2+}$, $CaGeO_3:Mn^{2+}$, $CaI_2:Eu^{2+}$, $CaLaBO_4:Eu^{3+}$, $CaLaB_3O_7:Ce^{3+},Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+},Mn^{2+}$, $Ca_2MgSi_2O_7:Eu^{2+},Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+},Na^+$, $CaO:Mn^{2+}$, $CaO:Pb^{2+}$, $CaO:Sb^{3+}$, $CaO:Sm^{3+}$, $CaO:Tb^{3+}$, $CaO:Zn^{2+}$, $Ca_2P_2O_7:Ce^{3+}$, $\alpha\text{-}Ca_3(PO_4)_2:Ce^{3+}$, $\beta\text{-}Ca_3(PO_4)_2:Ce^{3+}$, $Ca_5(PO_4)_3Cl:Eu^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, $\beta\text{-}Ca_3(PO_4)_2:Eu^{2+},Mn^{2+}$, $Ca_5(PO_4)_3F:Mn^{2+}$, $Ca_5(PO_4)_3F:Sb^{3+}$, $Ca_5(PO_4)_3F:Sn^{2+}$, $\alpha\text{-}Ca_3(PO_4)_2:Eu^{2+}$, $\beta\text{-}Ca_3(PO_4)_2:Eu^{2+}$, $Ca_2P_2O_7:Eu^{2+}$, $Ca_2P_2O_7:Eu^{2+},Mn^{2+}$, $CaP_2O_6:Mn^{2+}$, $\alpha\text{-}Ca_3(PO_4)_2:Pb^{2+}$, $\alpha\text{-}Ca_3(PO_4)_2:Sn^{2+}$, $\beta\text{-}Ca_3(PO_4)_2:Sn^{2+}$, $\beta\text{-}Ca_2P_2O_7:Sn,Mn$, $CaS:Bi^{3+}$, $CaS:Bi^{3+},Na$, $CaS:Ce^{3+}$, $CaS:Eu^{2+}$, $CaS:Cu^+,Na^+$, $CaS:La^{3+}$, $CaS:Mn^{2+}$, $CaSO_4:Bi$, $CaSO_4:Ce^{3+}$, $CaSO_4:Ce^{3+},Mn^{2+}$, $CaSO_4:Eu^{2+}$, $CaSO_4:Eu^{2+},Mn^{2+}$, $CaSO_4:Pb^{2+}$, $CaS:Pb^{2+}$, $CaS:Pb^{2+},Cl$, $CaS:Pb^{2+},Mn^{2+}$, $CaS:Pr^{3+},Pb^{2+},Cl$, $CaS:Sb^{3+}$, $CaS:Sb^{3+},Na$, $CaS:Sm^{3+}$, $CaS:Sn^{2+}$, $CaS:Sn^{2+},F$, $CaS:Tb^{3+}$, $CaS:Tb^{3+},Cl$, $CaSiO_3:Ce^{3+}$, $Ca_3SiO_4Cl_2:Eu^{2+}$, $Ca_3SiO_4Cl_2:Pb^{2+}$, $CaSiO_3:Eu^{2+}$, $CaSiO_3:Mn^{2+},Pb$, $CaSiO_3:Pb^{2+}$, $CaSiO_3:Pb^{2+},Mn^{2+}$, CaSiO$_3$:Ti$^{4+}$, CaSr$_2$(PO$_4$)$_2$:Bi$^{3+}$, β-(Ca,Sr)$_3$(PO$_4$)$_2$:Sn$^{2+}$ Mn$^{2+}$, CaTi$_{0.9}$Al$_{0.1}$O$_3$:Bi$^{3+}$, CaTiO$_3$:Eu$^{3+}$, CaTiO$_3$:Pr$^{3+}$, Ca$_5$(VO$_4$)$_3$Cl, CaWO$_4$, CaWO$_4$:Pb$^{2+}$, CaWO$_4$:W, Ca$_3$WO$_6$:U, CaYAlO$_4$:Eu$^{3+}$, CaYBO$_4$:Bi$^{3+}$, CaYBO$_4$:Eu$^{3+}$, CaYB$_{0.8}$O$_{3.7}$:Eu$^{3+}$, CaY$_2$ZrO$_6$:Eu$^{3+}$, (Ca,Zn,Mg)$_3$(PO$_4$)$_2$:Sn, CeF$_3$, (Ce,Mg)BaAl$_{11}$O$_{18}$:Ce, (Ce,Mg)SrAl$_{11}$O$_{18}$:Ce, CeMgAl$_{11}$O$_{19}$:Ce:Tb, Cd$_2$B$_6$O$_{11}$:Mn$^{2+}$, CdS:Ag$^+$,Cr, CdS:In, CdS:In, CdS:In,Te, CdS:Te, CdWO$_4$, CsF, CsI, CsI:Na$^+$, CsI:Tl, (ErCl$_3$)$_{0.25}$(BaCl$_2$)$_{0.75}$, GaN:Zn, Gd$_3$Ga$_5$O$_{12}$:Cr$^{3+}$, Gd$_3$Ga$_5$O$_{12}$:Cr,Ce, GdNbO$_4$:Bi$^{3+}$, Gd$_2$O$_2$S:Eu$^{3+}$, Gd$_2$O$_2$Pr$^{3+}$, Gd$_2$O$_2$S:Pr,Ce,F, Gd$_2$O$_2$S:Tb$^{3+}$, Gd$_2$SiO$_5$:Ce$^{3+}$, KGa$_{11}$O$_{17}$:Mn$^{2+}$, K$_2$La$_2$Ti$_3$O$_{10}$:Eu, KMgF$_3$:Eu$^{2+}$, KMgF$_3$:Mn$^{2+}$, K$_2$SiF$_6$:Mn$^{4+}$, LaAl$_3$B$_4$O$_{12}$:Eu$^{3+}$, LaAlB$_2$O$_6$:Eu$^{3+}$, LaAlO$_3$:Eu$^{3+}$, LaAlO$_3$:Sm$^{3+}$, LaAsO$_4$:Eu$^{3+}$, LaBr$_3$:Ce$^{3+}$, LaBO$_3$:Eu$^{3+}$, (La,Ce,Tb)PO$_4$:Ce:Tb, LaCl$_3$:Ce$^{3+}$, La$_2$O$_3$:Bi$^{3+}$, LaOBr:Tb$^{3+}$, LaOBr:Tm$^{3+}$, LaOCl:Bi$^{3+}$, LaOCl:Eu$^{3+}$, LaOF:Eu$^{3+}$, La$_2$O$_3$:Eu$^{3+}$, La$_2$O$_3$:Pr$^{3+}$, La$_2$O$_2$S:Tb$^{3+}$, LaPO$_4$:Ce$^{3+}$, LaPO$_4$:Eu$^{3+}$, LaSiO$_3$Cl:Ce$^{3+}$, LaSiO$_3$Cl:Ce$^{3+}$,Tb$^{3+}$, LaVO$_4$:Eu$^{3+}$, La$_2$W$_3$O$_{12}$:Eu$^{3+}$, LiAlF$_4$:Mn$^{2+}$, LiAl$_5$O$_8$:Fe$^{3+}$, LiAlO$_2$:Fe$^{3+}$, LiAlO$_2$:Mn$^{2+}$, LiAl$_5$O$_8$:Mn$^{2+}$, Li$_2$CaP$_2$O$_7$:Ce$^{3+}$,Mn$^{2+}$, LiCeBa$_4$Si$_4$O$_{14}$:Mn$^{2+}$, LiCeSrBa$_3$Si$_4$O$_{14}$:Mn$^{2+}$, LiInO$_2$:Eu$^{3+}$, LiInO$_2$:Sm$^{3+}$, LiLaO$_2$:Eu$^{3+}$, LuAlO$_3$:Ce$^{3+}$, (Lu,Gd)$_2$SiO$_5$:Ce$^{3+}$, Lu$_2$SiO$_5$:Ce$^{3+}$, Lu$_2$Si$_2$O$_7$:Ce$^{3+}$, LuTaO$_4$:Nb$^{5+}$, Lu$_{1-x}$Y$_x$AlO$_3$:Ce$^{3+}$, MgAl$_2$O$_4$:Mn$^{2+}$, MgSrAl$_{10}$O$_{17}$:Ce, MgB$_2$O$_4$:Mn$^{2+}$, MgBa$_2$(PO$_4$)$_2$:Sn$^{2+}$, MgBaP$_2$O$_7$:Eu$^{2+}$, MgBaP$_2$O$_7$:Eu$^{2+}$,Mn$^{2+}$, MgBa$_3$Si$_2$O$_8$:Eu$^{2+}$, MgBa(SO$_4$)$_2$:Eu$^{2+}$, Mg$_3$Ca$_3$(PO$_4$)$_4$:Eu$^{2+}$, MgCaP$_2$O$_7$:Mn$^{2+}$, Mg$_2$Ca(SO$_4$)$_3$:Eu$^{2+}$, Mg$_2$Ca(SO$_4$)$_3$:Eu$^{2+}$,Mn$^2$, MgCeAl$_n$O$_{19}$:Tb$^{3+}$, Mg$_4$(F)GeO$_6$:Mn$^{2+}$, Mg$_4$(F)(Ge,Sn)O$_6$:Mn$^{2+}$, MgF$_2$:Mn$^{2+}$, MgGa$_2$O$_4$:Mn$^{2+}$, Mg$_8$Ge$_2$O$_{11}$F$_2$:Mn$^{4+}$, MgS:Eu$^{2+}$, MgSiO$_3$:Mn$^{2+}$, Mg$_2$SiO$_4$:Mn$^{2+}$, Mg$_3$SiO$_3$F$_4$:Ti$^{4+}$, MgSO$_4$:Eu$^{2+}$, MgSO$_4$:Pb$^{2+}$, MgSrBa$_2$Si$_2$O$_7$:Eu$^{2+}$, MgSrP$_2$O$_7$:Eu$^{2+}$, MgSr$_5$(PO$_4$)$_4$:Sn$^{2+}$, MgSr$_3$Si$_2$O$_8$:Eu$^{2+}$,Mn$^{2+}$, Mg$_2$Sr(SO$_4$)$_3$:Eu$^{2+}$, Mg$_2$TiO$_4$:Mn$^{4+}$, MgWO$_4$, MgYBO$_4$:Eu$^{3+}$, Na$_3$Ce(PO$_4$)$_2$:Tb$^{3+}$, Na$_{1.23}$K$_{0.42}$Eu$_{0.12}$TiSi$_4$O$_{11}$:Eu$^{3+}$, Na$_{1.23}$K$_{0.42}$Eu$_{0.12}$TiSi$_5$O$_{13}$.xH$_2$O:Eu$^{3+}$, Na$_{1.29}$K$_{0.46}$Er$_{0.08}$TiSi$_4$O$_{11}$:Eu$^{3+}$, Na$_2$Mg$_3$Al$_2$Si$_2$O$_{10}$:Tb, Na(Mg$_{2-x}$Mn$_x$)LiSi$_4$O$_{10}$F$_2$:Mn, NaYF$_4$:Er$^{3+}$, Yb$^{3+}$, NaYO$_2$:Eu$^{3+}$, P46(70%)+P47 (30%), SrAl$_{12}$O$_{19}$:Ce$^{3+}$, Mn$^{2+}$, SrAl$_2$O$_4$:Eu$^{2+}$, SrAl$_4$O$_7$:Eu$^{3+}$, SrAl$_{12}$O$_{19}$:Eu$^{2+}$, SrAl$_2$S$_4$:Eu$^{2+}$, Sr$_2$B$_5$O$_9$Cl:Eu$^{2+}$, SrB$_4$O$_7$:Eu$^{2+}$(F,Cl,Br), SrB$_4$O$_7$:Pb$^{2+}$, SrB$_4$O$_7$:Pb$^{2+}$, Mn$^{2+}$, SrB$_8$O$_{13}$:Sm$^{2+}$, SrBaSiO$_4$:Eu$^{2+}$, Sr(Cl,Br,I)$_2$:Eu$^{2+}$ in SiO$_2$, SrCl$_2$:Eu$^{2+}$ in SiO$_2$, Sr$_5$Cl(PO$_4$)$_3$:Eu, SrF$_2$:Eu$^{2+}$, SrGa$_{12}$O$_{19}$:Mn$^{2+}$, SrGa$_2$S$_4$:Ce$^{3+}$, SrGa$_2$S$_4$:Eu$^{2+}$, SrGa$_2$S$_4$:Pb$^{2+}$, SrIn$_2$O$_4$:Pr$^{3+}$, Al$^{3+}$, (Sr,Mg)(PO$_4$)$_2$:Sn, SrMgSi$_2$O$_6$:Eu$^{2+}$, Sr$_2$MgSi$_2$O$_7$:Eu$^{2+}$, Sr$_3$MgSi$_2$O$_8$:Eu$^{2+}$, SrMoO$_4$:U, SrO.3B$_2$O$_3$:Eu$^{2+}$,Cl, β-SrO.3B$_2$O$_3$:Pb$^{2+}$, β-SrO.3B$_2$O$_3$:Pb$^{2+}$,Mn$^{2+}$, α-SrO.3B$_2$O$_3$:Sm$^{2+}$, Sr$_6$P$_5$BO$_{20}$:Eu, Sr$_5$(PO$_4$)$_3$Cl:Eu$^{2+}$, Sr$_5$(PO$_4$)$_3$Cl:Eu$^{2+}$,Pr$^{3+}$, Sr$_5$(PO$_4$)$_3$Cl:Mn$^{2+}$, Sr$_5$(PO$_4$)$_3$Cl:Sb$^{3+}$, Sr$_2$P$_2$O$_7$:Eu$^{2+}$, β-Sr$_3$(PO$_4$)$_2$:Eu$^{2+}$, Sr$_5$(PO$_4$)$_3$F:Mn$^{2+}$Sr$_5$(PO$_4$)$_3$F:Sb$^{3+}$, Sr$_5$(PO$_4$)$_3$F:Sb$^{3+}$, Mn$^{2+}$, Sr$_5$(PO$_4$)$_3$F:Sn$^{2+}$, Sr$_2$P$_2$O$_7$:Sn$^{2+}$, β-Sr$_3$(PO$_4$)$_2$:Sn$^{2+}$, β-Sr$_3$(PO$_4$)$_2$:Sn$^{2+}$,Mn$^{2+}$(Al), SrS:Ce$^{3+}$, SrS:Eu$^{2+}$, SrS:Mn$^{2+}$, SrS:Cu$^+$,Na, SrSO$_4$:Bi, SrSO$_4$:Ce$^{3+}$, SrSO$_4$:Eu$^{2+}$, SrSO$_4$:Eu$^{2+}$,Mn$^{2+}$, Sr$_5$Si$_4$O$_{10}$Cl$_6$:Eu$^{2+}$, Sr$_2$SiO$_4$:Eu$^{2+}$, SrTiO$_3$Pr$^{3+}$, SrTiO$_3$Pr$^{3+}$,Al$^{3+}$, SrY$_2$O$_3$:Eu$^{3+}$, ThO$_2$:Eu$^{3+}$, ThO$_2$:Pr$^{3+}$, ThO$_2$:Tb$^{3+}$, YAl$_3$B$_4$O$_{12}$:Bi$^{3+}$, YAl$_3$B$_4$O$_{12}$:Ce$^{3+}$, YAl$_3$B$_4$O$_{12}$:Ce$^{3+}$,Mn, YAl$_3$B$_4$O$_{12}$:Ce$^{3+}$,Tb$^{3+}$, YAl$_3$B$_4$O$_{12}$:Eu$^{3+}$, YAl$_3$B$_4$O$_{12}$:Eu$^{3+}$,Cr$^{3+}$, YAl$_3$B$_4$O$_{12}$:Th$^{4+}$,Ce$^{3+}$,Mn$^{2+}$, YAlO$_3$:Ce$^{3+}$, Y$_3$Al$_5$O$_{12}$:Ce$^{3+}$, Y$_3$Al$_5$O$_{12}$:Cr$^{3+}$, YAlO$_3$:Eu$^{3+}$, Y$_3$Al$_5$O$_{12}$:Eu$^{3+}$, Y$_4$Al$_2$O$_9$:Eu$^{3+}$, Y$_3$Al$_5$O$_{12}$:Mn$^{4+}$, YAlO$_3$:Sm$^{3+}$, YAlO$_3$:Tb$^{3+}$, Y$_3$Al$_5$O$_{12}$:Tb$^{3+}$, YAsO$_4$:Eu$^{3+}$, YBO$_3$:Ce$^{3+}$, YBO$_3$:Eu$^{3+}$, YF$_3$:Er$^{3+}$, Yb$^{3+}$, YF$_3$:Mn$^{2+}$, YF$_3$:Mn$^{2+}$,Th$^{4+}$, YF$_3$:Tm$^{3+}$,Yb$^{3+}$, (Y,Gd)BO$_3$:Eu, (Y,Gd)BO$_3$:Tb, (Y,Gd)$_2$O$_3$:Eu$^{3+}$, Y$_{1.34}$Gd$_{0.60}$O$_3$(Eu,Pr), Y$_2$O$_3$:Bi$^{3+}$, YOBr:Eu$^{3+}$, Y$_2$O$_3$:Ce, Y$_2$O$_3$:Er$^{3+}$, Y$_2$O$_3$:Eu$^{3+}$(YOE), Y$_2$O$_3$:Ce$^{3+}$,Tb$^{3+}$, YOCl:Ce$^{3+}$, YOCl:Eu$^{3+}$, YOF:Eu$^{3+}$, YOF:Tb$^{3+}$, Y$_2$O$_3$:Ho$^{3+}$, Y$_2$O$_2$S:Eu$^{3+}$, Y$_2$O$_2$S:Pr$^{3+}$, Y$_2$O$_2$S:Tb$^{3+}$, Y$_2$O$_3$:Tb$^{3+}$, YPO$_4$:Ce$^{3+}$, YPO$_4$:Ce$^{3+}$,Tb$^{3+}$, YPO$_4$:Eu$^{3+}$, YPO$_4$:Mn$^{2+}$,Th$^{4+}$, YPO$_4$:V$^{5+}$, Y(P,V)O$_4$:Eu, Y$_2$SiO$_5$:Ce$^{3+}$, YTaO$_4$, YTaO$_4$:Nb$^{5+}$, YVO$_4$:Dy$^{3+}$, YVO$_4$:Eu$^{3+}$, ZnAl$_2$O$_4$:Mn$^{2+}$, ZnB$_2$O$_4$:Mn$^{2+}$, ZnBa$_2$S$_3$:Mn$^{2+}$, (Zn,Be)$_2$SiO$_4$:Mn$^{2+}$, Zn$_{0.4}$Cd$_{0.6}$S:Ag, Zn$_{0.6}$Cd$_{0.4}$S:Ag, (Zn,Cd)S:Ag,Cl, (Zn,Cd)S:Cu, ZnF$_2$:Mn$^{2+}$, ZnGa$_2$O$_4$, ZnGa$_2$O$_4$:Mn$^{2+}$, ZnGa$_2$S$_4$:Mn$^{2+}$, Zn$_2$GeO$_4$:Mn$^{2+}$, (Zn,Mg)F$_2$:Mn$^{2+}$, ZnMg$_2$(PO$_4$)$_2$:Mn$^{2+}$, (Zn,Mg)$_3$(PO$_4$)$_2$:Mn$^{2+}$, ZnO:Al$^{3+}$,Ga$^{3+}$, ZnO:Bi$^{3+}$, ZnO:Ga$^{3+}$, ZnO:Ga, ZnO—CdO:Ga, ZnO:S, ZnO:Se, ZnO:Zn, ZnS:Ag$^+$,Cl$^-$, ZnS:Ag,Cu,Cl, ZnS:Ag,Ni, ZnS:Au,In, ZnS—CdS (25-75), ZnS—CdS (50-50), ZnS—CdS (75-25), ZnS—CdS:Ag,Br,Ni, ZnS—CdS:Ag$^+$,Cl, ZnS—CdS:Cu,Br, ZnS—CdS:Cu,I, ZnS:Cl$^-$, ZnS:Eu$^{2+}$, ZnS:Cu, ZnS:Cu$^+$,Al$^{3+}$, ZnS:Cu+,Cl$^-$, ZnS:Cu,Sn, ZnS:Eu$^{2+}$, ZnS:Mn$^{2+}$, ZnS:Mn,Cu, ZnS:Mn$^{2+}$,Te$^{2+}$, ZnS:P, ZnS:P$^{3-}$,Cl$^-$, ZnS:Pb$^{2+}$, ZnS:Pb$^{2+}$,Cl$^-$, ZnS:Pb,Cu, Zn$_3$(PO$_4$)$_2$:Mn$^{2+}$, Zn$_2$SiO$_4$:Mn$^{2+}$, Zn$_2$SiO$_4$:Mn$^{2+}$, As$^{5+}$, Zn$_2$SiO$_4$:Mn,Sb$_2$O$_2$, Zn$_2$SiO$_4$:Mn$^{2+}$,P, Zn$_2$SiO$_4$:Ti$^{4+}$, ZnS:Sn$^{2+}$, ZnS:Sn,Ag, ZnS:Sn$^{2+}$,Li$^+$, ZnS:Te,Mn, ZnS—ZnTe:Mn$^{2+}$, ZnSe:Cu$^+$,Cl and ZnWO$_4$. Wherein, in these formulae having two metals with valencies indicate by x and 1-x, the x is from 0 to 1 and in these formulae having two metals with valencies indicate by x and 2-x, the x is from 0 to 2.

In the above and below formulae, the indication of two metals in parentheses, e.g., (Y,Gd), means the presence of one of those metals in the alternative or a mixture of those metals in any ratio to meet the valency indicated by the formula.

Particularly suitable yellow- and green-emitting phosphors which can be combined with the compounds according to the invention are selected, for example, from the group consisting of Lu$_3$(Al$_{1-x}$Ga$_x$)$_5$O$_{12}$:Ce, LiTb(Mo$_{1-x}$W$_x$)$_2$O$_8$, Tb$_2$(Mo$_{1-x}$W$_x$)O$_6$, Tb$_2$(Mo$_{1-x}$W$_x$)$_2$O$_9$, Tb$_2$(Mo$_{1-x}$W$_x$)$_3$O$_{12}$, Tb$_2$(Mo$_{1-x}$W$_x$)$_4$O$_{15}$, (Ba$_{1-x}$Sr$_x$)$_2$SiO$_4$:Eu, (Ba$_{1-x}$Sr$_x$)$_2$SiO$_5$:Eu, (Y,Gd)BO$_3$:CeTb, Y$_2$SiO$_5$:CeTb, Y$_2$Si$_2$O$_7$:Ce,Tb, Ca$_3$Y$_2$[Si$_3$O$_9$]$_2$:CeTb, [Tb(benzoate)$_3$], [Tb(picolinate)$_3$], [Tb(aminophenolate)$_3$], and Tb[N(CN)$_2$]$_3$. The index x here is between 0 and 1.

The phosphors or phosphor combinations according to the invention can either be dispersed in a resin (for example epoxy or silicone resin) or, in the case of suitable size ratios, arranged directly on the primary light source or alternatively arranged remote therefrom, depending on the application (the latter arrangement also includes "remote phosphor technology"). The advantages of remote phosphor technology are known to the person skilled in the art and are revealed, for example, by the following publication: Japanese J. of Appl. Phys. Vol. 44, No. 21 (2005). L649-L651.

In a further embodiment, it is preferred for the optical coupling between the phosphor and the primary light source to be achieved by a light-conducting arrangement. This makes it possible for the primary light source to be installed at a central location and to be optically coupled to the phosphor by means of light-conducting devices, such as, for example, optical fibres. In this way, it is possible to achieve lamps adapted to the lighting wishes which merely consist of one or different phosphors, which can be arranged to form a light screen, and an optical waveguide, which is coupled to the primary light source. In this way, it is possible to place a strong primary light source at a location which is favourable for electrical installation and to install lamps comprising phosphors which are coupled to the optical waveguides at any desired locations without further electrical cabling, but instead only by laying optical waveguides.

The invention furthermore relates to a lighting unit, in particular for the backlighting of display devices, characterised in that it comprises at least one light source according to the invention, and to a display device, in particular liquid-crystal display device (LC display), with backlighting, characterised in that it comprises at least one lighting unit according to the invention.

For use in LEDs, the phosphors can also be converted into any desired outer shapes, such as spherical particles, platelets and structured materials and ceramics. These shapes are in accordance with the invention summarised under the term "shaped bodies". The shaped body is preferably a "phosphor body". The present invention thus furthermore relates to a shaped body comprising the phosphors according to the invention. The production and use of corresponding shaped bodies are familiar to the person skilled in the art from numerous publications.

Since $Mn^{2+}$ is only employed in low concentrations in the silicates described here, it is also advantageous to use the phosphors according to the invention in the form of translucent ceramics, since the optical path length, i.e. the thickness of the ceramic layer, in ceramic luminescence conversion screens can be increased owing to the reduced scattering compared with a powder layer. The present invention therefore furthermore relates to a ceramic comprising at least one compound according to the invention. The ceramic may then consist only of the compound according to the invention. However, it may also comprise matrix materials and/or further phosphors. Suitable matrix materials are, for example, $SiO_2$, $Y_2O_3$ or $Al_2O_3$.

The compounds according to the invention have the following advantageous properties:
1) The compounds according to the invention have a high photoluminescence quantum efficiency.
2) The compounds according to the invention exhibit emission both in the blue and also in the red spectral region, so that they lead to white light having good colour reproduction on use with only one further phosphor which emits in the yellow or green spectral region.
3) The compounds according to the invention have high chemical stability.

All variants of the invention described here can be combined with one another so long as the respective embodiments are not mutually exclusive. In particular, it is an obvious operation, on the basis of the teaching of this specification, precisely as part of routine optimisation, to combine various variants described here in order to obtain a specific particularly preferred embodiment. The following examples are intended to illustrate the present invention and show, in particular, the result of such illustrative combinations of the invention variants described. However, they should in no way be regarded as limiting, but instead are intended to stimulate generalisation. All compounds or components which are used in the preparations are either known and commercially available or can be synthesised by known methods. The temperatures indicated in the examples are always in ° C. It furthermore goes without saying that, both in the description and also in the examples, the amounts of the components added in the compositions always add up to a total of 100%. Percent data should always be regarded in the given connection.

EXAMPLES

The phase formation of the samples was in each case checked by means of X-ray diffractometry. For this purpose, a Rigaku Miniflex II X-ray diffractometer with Bragg-Brentano geometry was used. The radiation source used was an X-ray tube with Cu-K$\alpha$ radiation ($\lambda$=0.15418 nm). The tube was operated at a current strength of 15 mA and a voltage of 30 kV. The measurement was carried out in an angle range of 10-80° at 10°·min$^{-1}$.

Reflection spectra were determined using an Edinburgh Instruments Ltd. fluorescence spectrometer. For this purpose, the samples were placed and measured in a $BaSO_4$-coated Ulbricht sphere. Reflection spectra were recorded in a range from 250-800 nm. The white standard used was $BaSO_4$ (Alfa Aesar 99.998%). A 450 W Xe lamp was used as excitation source.

The excitation spectra and emission spectra were recorded using an Edinburgh Instruments Ltd. fluorescence spectrometer fitted with mirror optics for powder samples. The excitation source used was a 450 W Xe lamp.

Example 1

Preparation of $Ba_{0.99}Eu_{0.01}Ca_{1.90}Mn_{0.10}Si_3O_9$

For the synthesis of 3 g (6.7059 mmol) of $Ba_{0.99}Eu_{0.01}Ca_{1.90}Mn_{0.10}Si_3O_9$, 1.3101 g (6.6389 mmol) of $BaCO_3$, 0.0118 g (0.0335 mmol) of $Eu_2O_3$, 1.2752 g (12.7412 mmol) of $CaCO_3$, 0.1200 g (0.6706 mmol) of $MnC_2O_4 \cdot 2H_2O$, 1.2088 g (20.117 mmol) of $SiO_2$ and 0.0083 g (0.1341 mmol) of $H_3BO_3$ are mixed with one another in acetone in an agate mortar. The mixture is dried firstly in air at room temperature and subsequently at 80° C. in a drying cabinet. The dry starting-material mixture is subsequently calcined at 1200° C. for 8 h in a forming-gas atmosphere (5% of $H_2$/95% of $N_2$).

The CIE colour point of $Ba_{0.99}Eu_{0.01}Ca_{1.90}Mn_{0.10}Si_3O_9$ is x=0.262 and y=0.153.

Example 2

Preparation of $Ba_{0.95}Eu_{0.05}Ca_{1.90}Mn_{0.10}Si_3O_9$

For the synthesis of 4 g (8.9295 mmol) of $Ba_{0.95}Eu_{0.05}Ca_{1.90}Mn_{0.10}Si_3O_9$, 1.6740 g (8.4831 mmol) of $BaCO_3$, 0.0786 g (0.2232 mmol) of $Eu_2O_3$, 1.6981 g (16.9661 mmol) of $CaCO_3$, 0.1598 g (0.8930 mmol) of $MnC_2O_4 \cdot 2H_2O$, 1.6096 g (26.7886 mmol) of $SiO_2$ and 0.0110 g (0.1786 mmol) of $H_3BO_3$ are mixed with one another in acetone in an agate mortar. The mixture is dried firstly in air at room temperature and subsequently at 80° C. in a drying cabinet. The dry starting-material mixture is subsequently calcined at 1200° C. for 8 h in a forming-gas atmosphere (5% of $H_2$/95% of $N_2$).

The CIE colour point of $Ba_{0.95}Eu_{0.05}Ca_{1.90}Mn_{0.10}Si_3O_9$ is x=0.357 and y=0.247.

Example 3

Preparation of $Ba_{0.90}Eu_{0.10}Ca_{1.90}Mn_{0.10}Si_3O_9$

For the synthesis of 4 g (8.9150 mmol) of $Ba_{0.90}Eu_{0.10}Ca_{1.90}Mn_{0.10}Si_3O_9$, 1.5833 g (8.0235 mmol) of $BaCO_3$, 0.1569 g (0.4457 mmol) of $Eu_2O_3$, 1.6953 g (16.9384 mmol) of $CaCO_3$, 0.1596 g (0.8915 mmol) of $MnC_2O_4 \cdot 2H_2O$, 1.6069 g (26.7449 mmol) of $SiO_2$ and 0.0110 g (0.1783 mmol) of $H_3BO_3$ are mixed with one another in acetone in an agate mortar. The mixture is dried firstly in air at room temperature and subsequently at 80° C. in a drying cabinet.

The dry starting-material mixture is subsequently calcined at 1200° C. for 8 h in a forming-gas atmosphere (5% of $H_2$/95% of $N_2$).

The CIE colour point of $Ba_{0.90}Eu_{0.10}Ca_{1.90}Mn_{0.10}Si_3O_9$ is x=0.427 and y=0.313.

Example 4

Preparation of $Ba_{0.79}Sr_{0.20}Eu_{0.01}Ca_{1.90}Mn_{0.10}Si_3O_9$

For the synthesis of 5.2491 g (12 mmol) of $Ba_{0.79}Sr_{0.20}Eu_{0.01}Ca_{1.90}Mn_{0.10}Si_3O_9$, 1.8707 g (9.48 mmol) of $BaCO_3$, 0.3543 g (2.40 mmol) of $SrCO_3$, 0.0211 g (0.06 mmol) of $Eu_2O_3$, 2.2820 g (22.80 mmol) of $CaCO_3$, 0.2148 g (1.20 mmol) of $MnC_2O_4.2H_2O$, 2.1630 g (36.00 mmol) of $SiO_2$ and 0.0525 g (0.8489 mmol) of $H_3BO_3$ are mixed with one another in acetone in an agate mortar. The dry starting-material mixture is subsequently calcined at 1200° C. for 8 h in a forming-gas atmosphere (5% of $H_2$/95% of $N_2$). The spectrum of the phosphor-converted LED described in this example is shown in FIG. 19.

Example 5

Preparation of $Ba_{0.99}Eu_{0.01}Ca_{1.50}Sr_{0.40}Mn_{0.10}Si_3O_9$

For the synthesis of 5.5966 g (12 mmol) of $Ba_{0.99}Eu_{0.01}Ca_{1.50}Sr_{0.40}Mn_{0.10}Si_3O_9$, 2.3444 g (11.88 mmol) of $BaCO_3$, 0.7086 g (4.80 mmol) of $SrCO_3$, 0.0211 g (0.06 mmol) of $Eu_2O_3$, 1.8016 g (18.00 mmol) of $CaCO_3$, 0.2148 g (1.20 mmol) of $MnC_2O_4.2H_2O$, 2.1630 g (36.00 mmol) of $SiO_2$ and 0.0560 g (0.9051 mmol) of $H_3BO_3$ are mixed with one another in acetone in an agate mortar. The mixture is dried firstly in air at room temperature and subsequently at 80° C. in a drying cabinet. The dry starting-material mixture is subsequently calcined at 1200° C. for 8 h in a forming-gas atmosphere (5% of $H_2$/95% of $N_2$). The spectrum of the phosphor-converted LED described in this example is showed in FIG. 20.

Example 6

Preparation of $Ba_{0.99}Eu_{0.01}Ca_{1.50}Mg_{0.40}Mn_{0.10}Si_3O_9$

For the synthesis of 5.2927 g (12 mmol) of $Ba_{0.99}Eu_{0.01}Ca_{1.50}Mg_{0.40}Mn_{0.10}Si_3O_9$, 2.3444 g (11.88 mmol) of $BaCO_3$, 0.4662 g (0.96 mmol) of $4MgCO_3.Mg(OH)_2.5H_2O$, 0.0211 g (0.06 mmol) of $Eu_2O_3$, 1.8016 g (18.00 mmol) of $CaCO_3$, 0.2148 g (1.20 mmol) of $MnC_2O_4.2H_2O$, 2.1630 g (36.00 mmol) of $SiO_2$ and 0.0560 g (0.9051 mmol) of $H_3BO_3$ are mixed with one another in acetone in an agate mortar. The mixture is dried firstly in air at room temperature and subsequently at 80° C. in a drying cabinet. The dry starting-material mixture is subsequently calcined at 1200° C. for 8 h in a forming-gas atmosphere (5% of $H_2$/95% of $N_2$). The spectrum of the phosphor-converted LED described in this example is shown in FIG. 21.

Example 7

Production of a pc-LED using $Ba_{0.90}Eu_{0.10}Ca_{1.90}Mn_{0.10}Si_3O_9$ from Example 3

1 g of the phosphor of the composition $Ba_{0.90}Eu_{0.10}Ca_{1.90}Mn_{0.10}Si_3O_9$ is weighed out, 4 g of an optically transparent silicone are added, and the mixture is subsequently mixed homogeneously in a planetary centrifugal mixer so that the phosphor concentration in the overall mass is 20% by weight. The silicone/phosphor mixture obtained in this way is applied to the chip of a near-UV semiconductor LED with the aid of an automatic dispenser and cured with supply of heat. The near-UV semiconductor LEDs used in the present example for the LED characterisation have an emission wavelength of 395 nm and are operated at a current strength of 350 mA. The lighting characterisation of the LED is carried out using an Instrument Systems CAS 140 spectrometer and an ISP 250 integration sphere connected thereto. The LED is characterised via the determination of the wavelength-dependent spectral power density. The resultant spectrum of the light emitted by the LED is used to calculate the colour point coordinates CIE x and y.

Example 8

Production of a pc-LED Using $Ba_{0.79}Sr_{0.20}Eu_{0.01}Ca_{1.90}Mn_{0.10}Si_3O_9$ from Example 4

1 g of the phosphor of the composition $Ba_{0.79}Sr_{0.20}Eu_{0.01}Ca_{1.90}Mn_{0.10}Si_3O_9$ is weighed out, 4 g of an optically transparent silicone are added, and the mixture is subsequently mixed homogeneously in a planetary centrifugal mixer so that the phosphor concentration in the overall mass is 20% by weight. The silicone/phosphor mixture obtained in this way is applied to the chip of a near-UV semiconductor LED with the aid of an automatic dispenser and cured with supply of heat. The near-UV semiconductor LEDs used in the present example for the LED characterisation have an emission wavelength of 395 nm and are operated at a current strength of 350 mA. The lighting characterisation of the LED is carried out using an Instrument Systems CAS 140 spectrometer and an ISP 250 integration sphere connected thereto. The LED is characterised via the determination of the wavelength-dependent spectral power density. The resultant spectrum of the light emitted by the LED is used to calculate the colour point coordinates CIE x and y.

Example 9

Production of a pc-LED Using $Ba_{0.99}Eu_{0.01}Ca_{1.50}Sr_{0.40}Mn_{0.10}Si_3O_9$ from Example 5

1 g of the phosphor of the composition $Ba_{0.99}Eu_{0.01}Ca_{1.50}Sr_{0.40}Mn_{0.10}Si_3O_9$ is weighed out, 4 g of an optically transparent silicone are added, and the mixture is subsequently mixed homogeneously in a planetary centrifugal mixer so that the phosphor concentration in the overall mass is 20% by weight. The silicone/phosphor mixture obtained in this way is applied to the chip of a near-UV semiconductor LED with the aid of an automatic dispenser and cured with supply of heat. The near-UV semiconductor LEDs used in the present example for the LED characterisation have an emission wavelength of 395 nm and are operated at a current strength of 350 mA. The lighting characterisation of the LED is carried out using an Instrument Systems CAS 140 spectrometer and an ISP 250 integration sphere connected thereto. The LED is characterised via the determination of the wavelength-dependent spectral power density. The resultant spectrum of the light emitted by the LED is used to calculate the colour point coordinates CIE x and y.

All the quantities mentioned above are calculated from emission spectra of the light source by methods familiar to the person skilled in the art.

Figure 1:
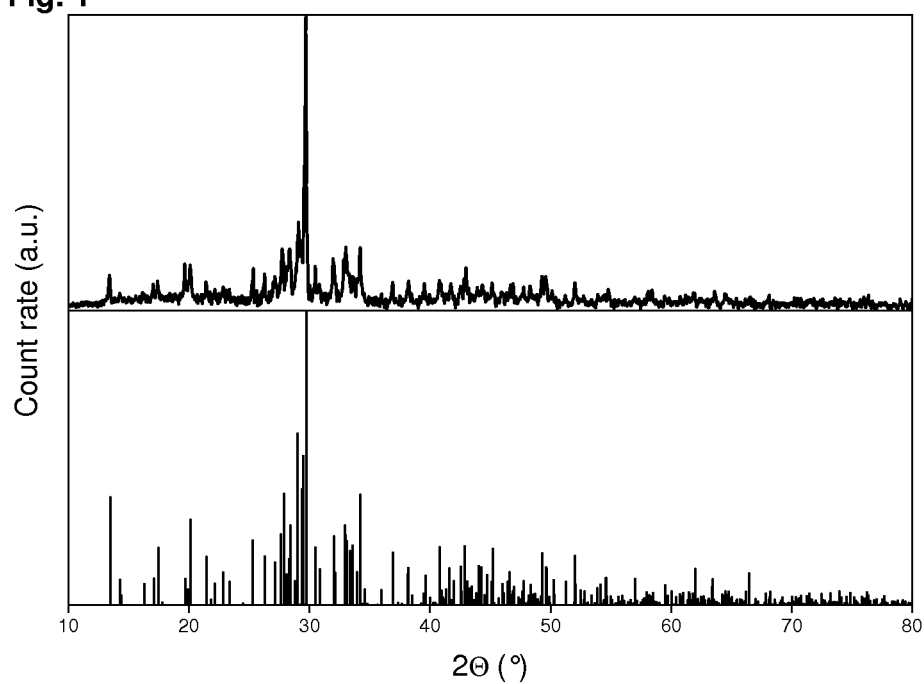
FIG. 1: X-ray powder diffraction pattern of $Ba_{0.99}Eu_{0.01}Ca_{1.90}Mn_{0.10}Si_3O_9$ (top) and the reference card PDF-4+ (ICDD) 04-009-3303 of $BaCa_2Si_3O_9$ (bottom).
Figure 2:
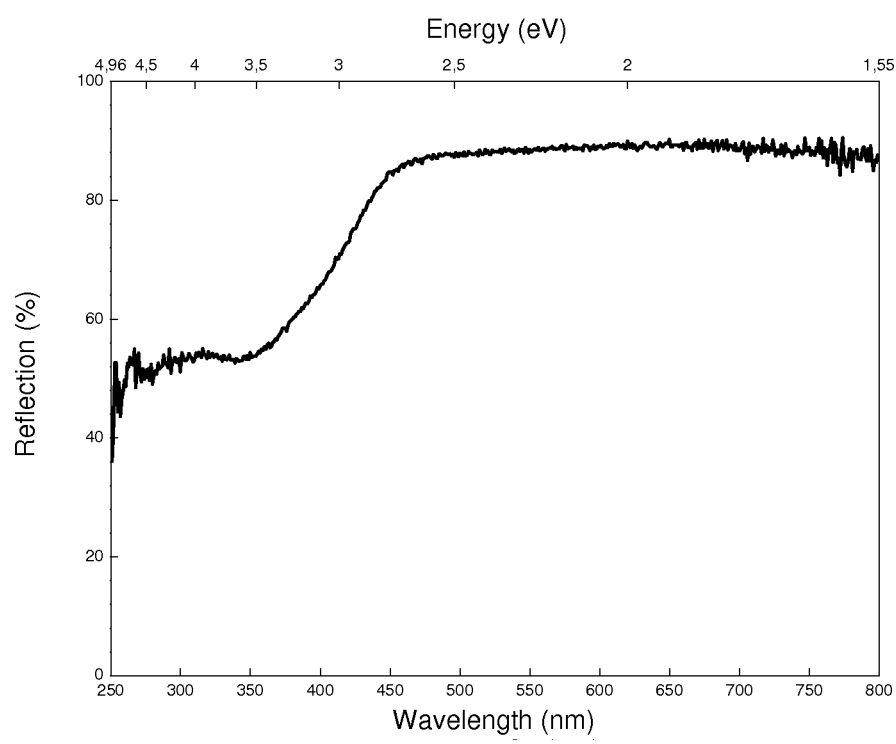
FIG. 2: Reflection spectrum of $Ba_{0.99}Eu_{0.01}Ca_{1.90}Mn_{0.10}Si_3O_9$.
Figure 3:
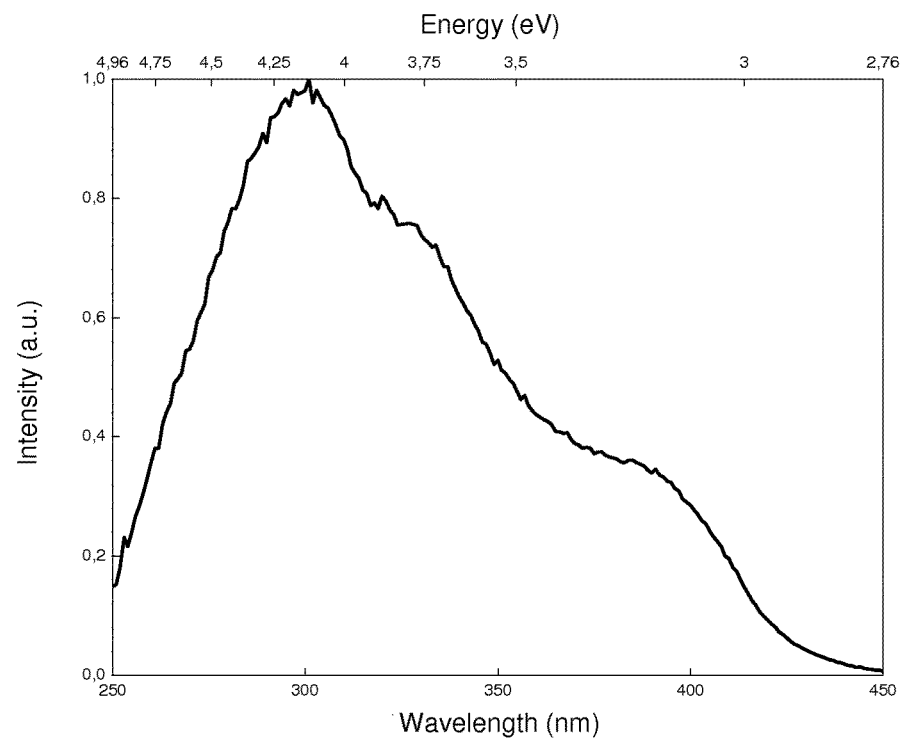
FIG. 3: Excitation spectrum of $Ba_{0.99}Eu_{0.01}Ca_{1.90}Mn_{0.10}Si_3O_9$ ($\lambda_{em}$=590 nm).
Figure 4:
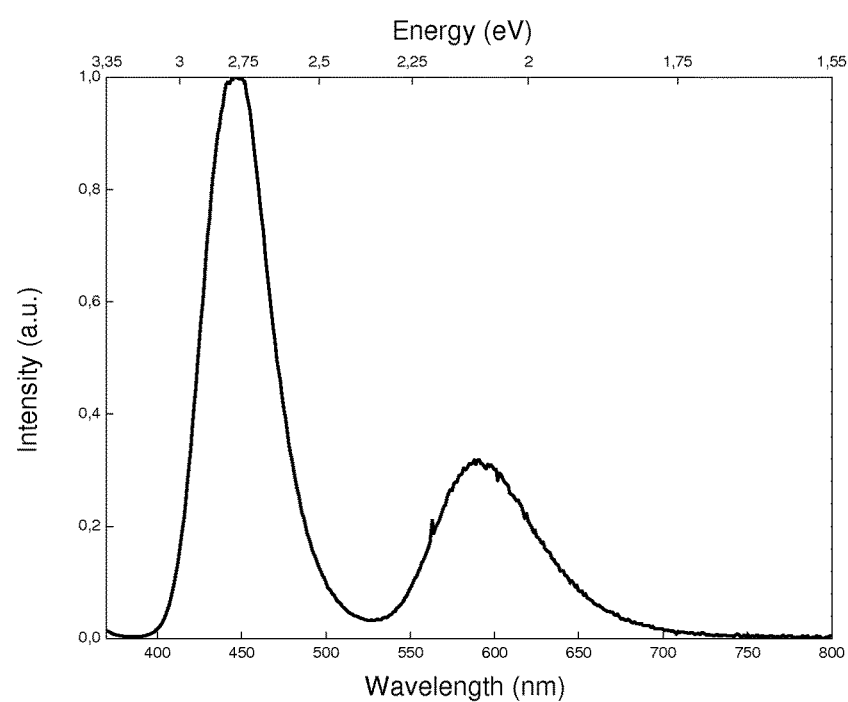
FIG. 4: Emission spectrum of $Ba_{0.99}Eu_{0.01}Ca_{1.90}Mn_{0.10}Si_3O_9$ ($\lambda_{ex}$=350 nm).
Figure 5:
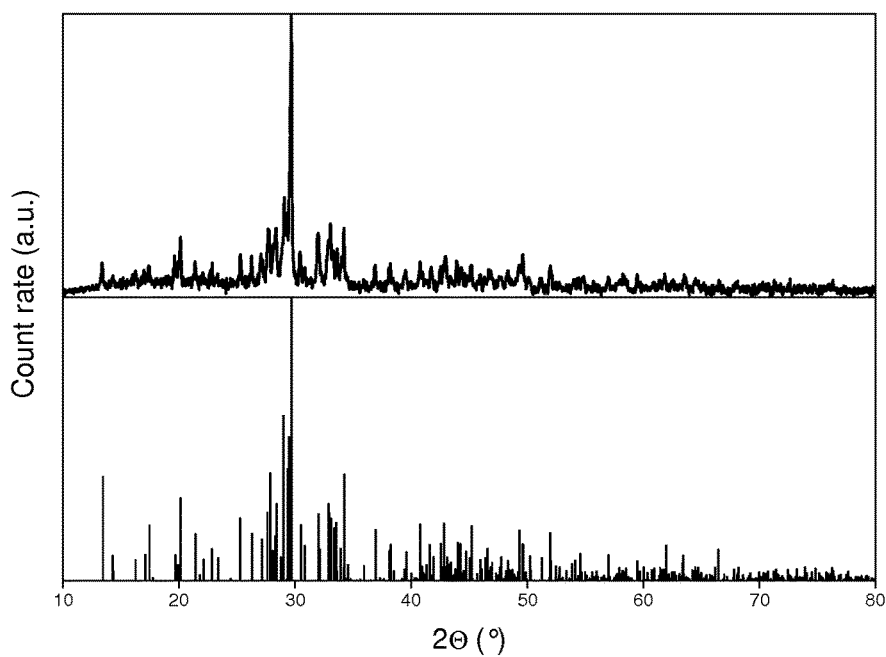
FIG. 5: Powder diffraction pattern of $Ba_{0.95}Eu_{0.05}Ca_{1.90}Mn_{0.10}Si_3O_9$ (top) and the reference card PDF-4+ (ICDD) 04-009-3303 of $BaCa_2Si_3O_9$ (bottom).
Figure 6:
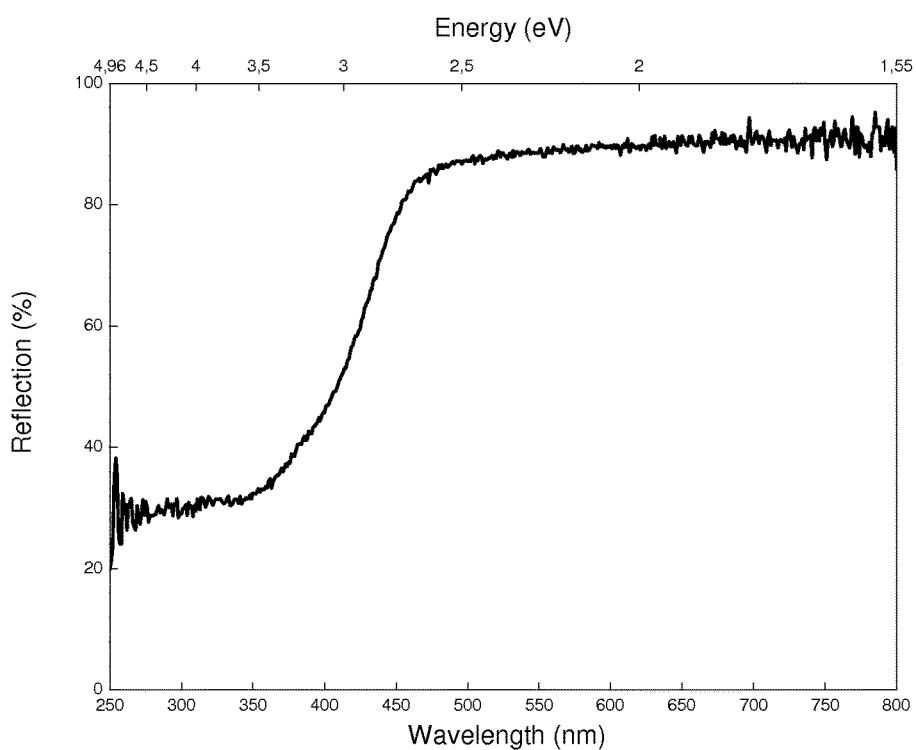
FIG. 6: Reflection spectrum of $Ba_{0.95}Eu_{0.05}Ca_{1.90}Mn_{0.10}Si_3O_9$.
Figure 7:
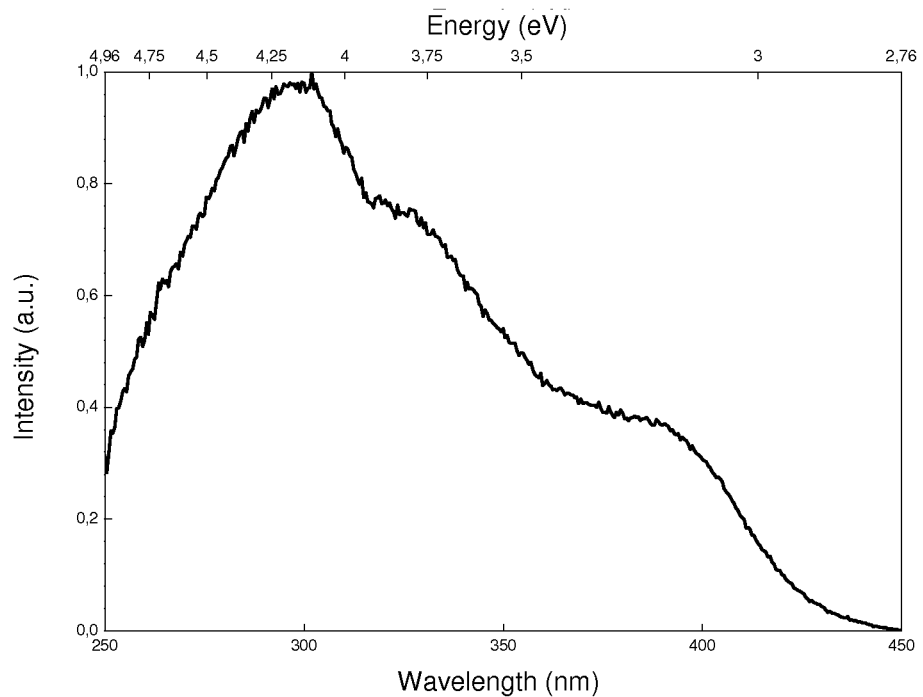
FIG. 7: Excitation spectrum of $Ba_{0.95}Eu_{0.05}Ca_{1.90}Mn_{0.10}Si_3O_9$ ($\lambda_{em}$=590 nm).
Figure 8:
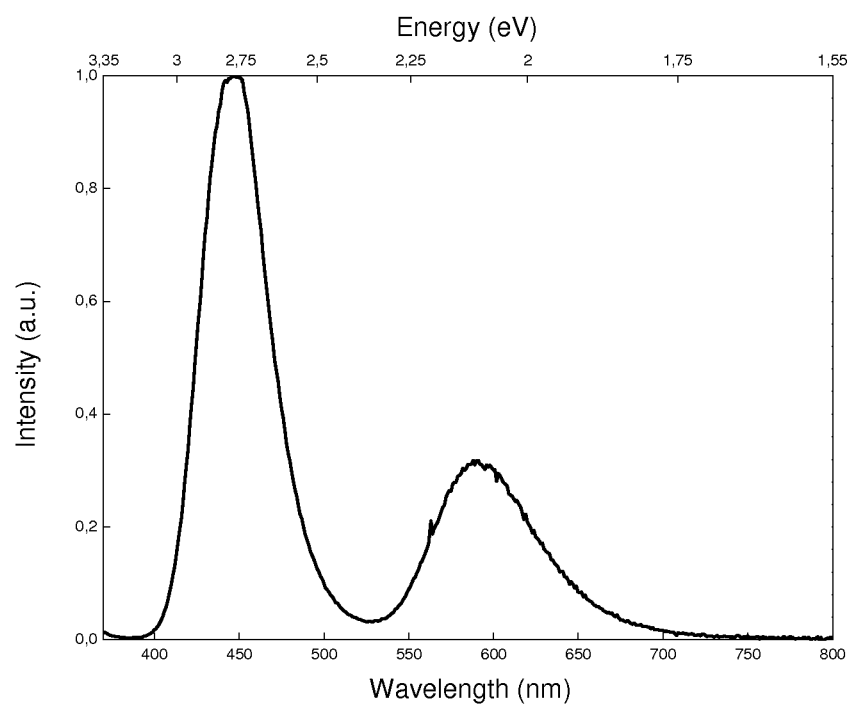
FIG. 8: Emission spectrum of $Ba_{0.95}Eu_{0.05}Ca_{1.90}Mn_{0.10}Si_3O_9$ ($\lambda_{ex}$=350 nm).
Figure 9:
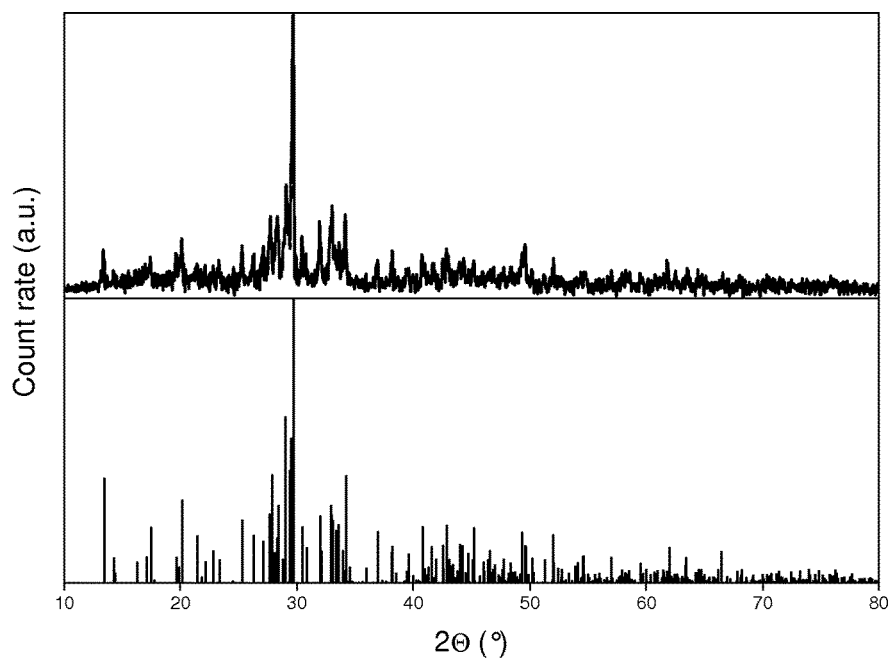
FIG. 9: X-ray powder diffraction pattern of $Ba_{0.90}Eu_{0.10}Ca_{1.90}Mn_{0.10}Si_3O_9$ (top) and the reference card PDF-4+ (ICDD) 04-009-3303 of $BaCa_2Si_3O_9$ (bottom).
Figure 10:
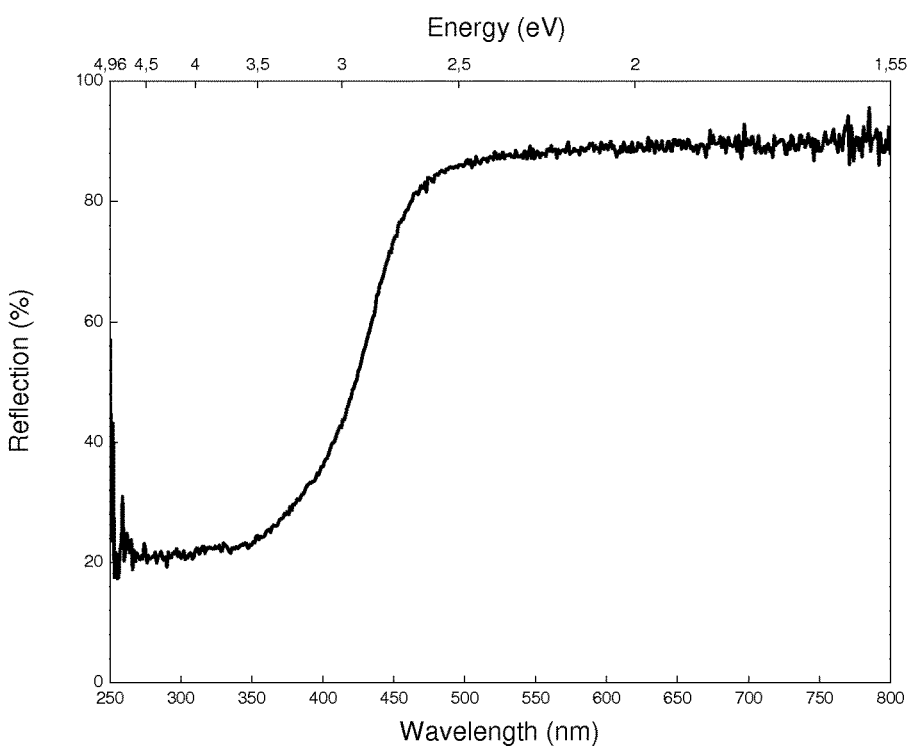
FIG. 10: Reflection spectrum of $Ba_{0.90}Eu_{0.10}Ca_{1.90}Mn_{0.10}Si_3O_9$.
Figure 11:
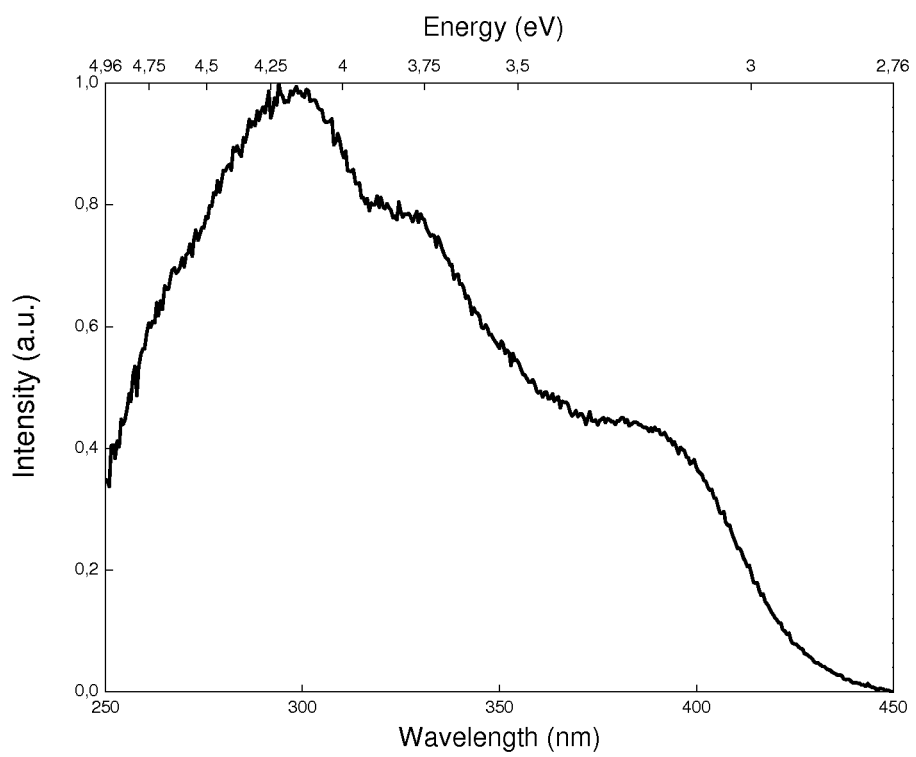
FIG. 11: Excitation spectrum of $Ba_{0.90}Eu_{0.10}Ca_{1.90}Mn_{0.10}Si_3O_9$ ($\lambda_{em}$=590 nm).
Figure 12:
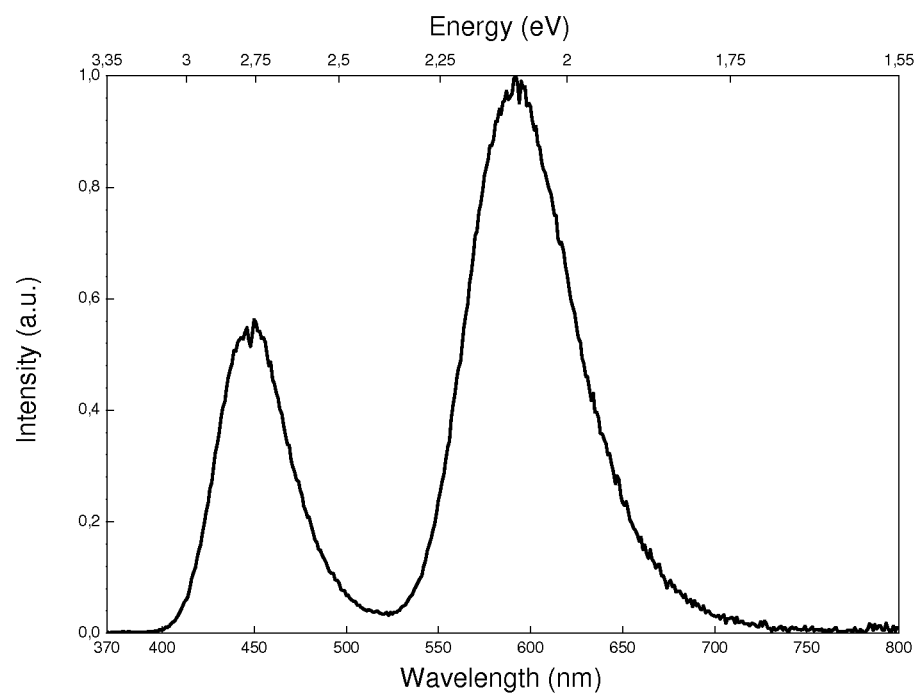
FIG. 12: Emission spectrum of $Ba_{0.90}Eu_{0.10}Ca_{1.90}Mn_{0.10}Si_3O_9$ ($\lambda_{ex}$=350 nm).
Figure 13:
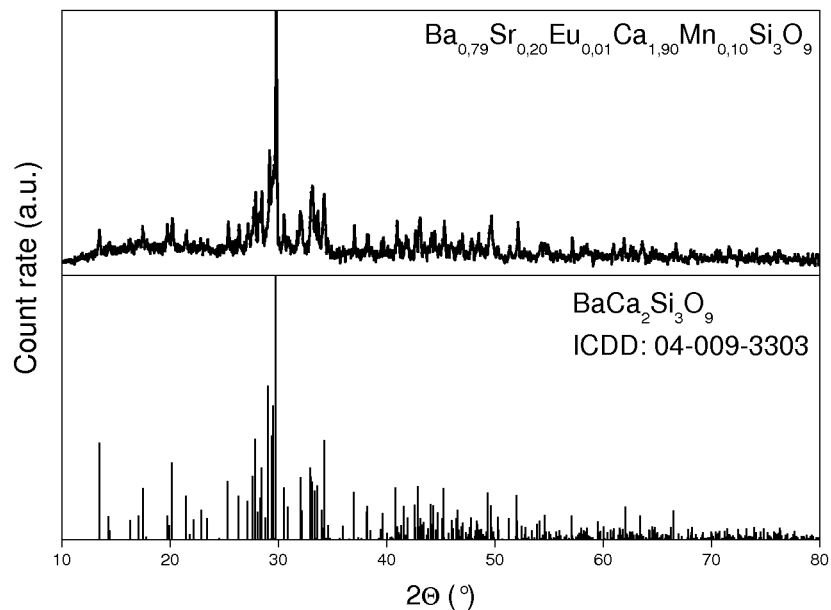
FIG. 13: X-ray powder diffraction pattern of $Ba_{0.79}Sr_{0.20}Eu_{0.01}Ca_{1.90}Mn_{0.10}Si_3O_9$ (top) and the reference card 04-009-3303 of $BaCaSi_3O_9$ (bottom).
Figure 14:
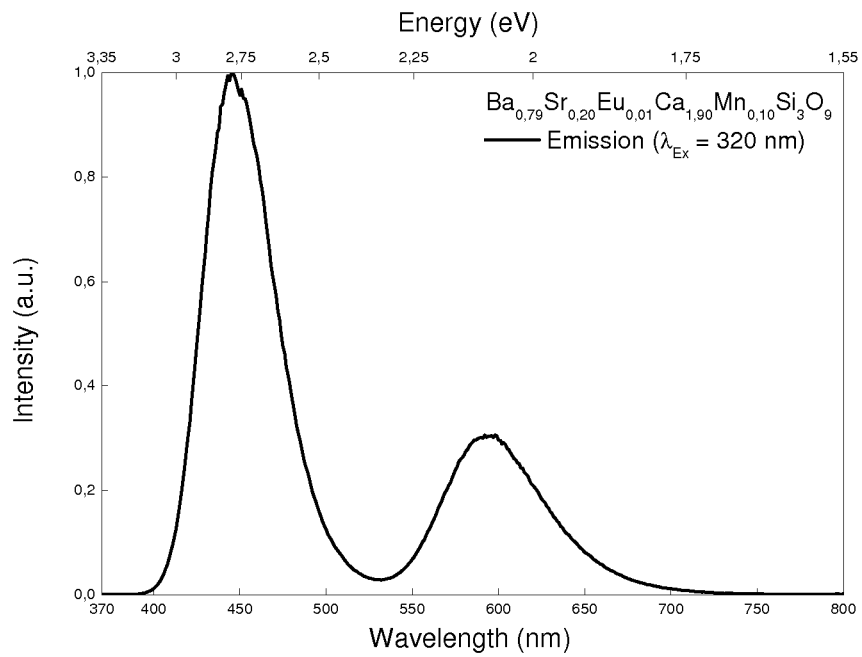
FIG. 14: Emission spectrum of $Ba_{0.79}Sr_{0.20}Eu_{0.01}Ca_{1.90}Mn_{0.10}Si_3O_9$ ($\lambda_{ex}$=320 nm).
Figure 15:
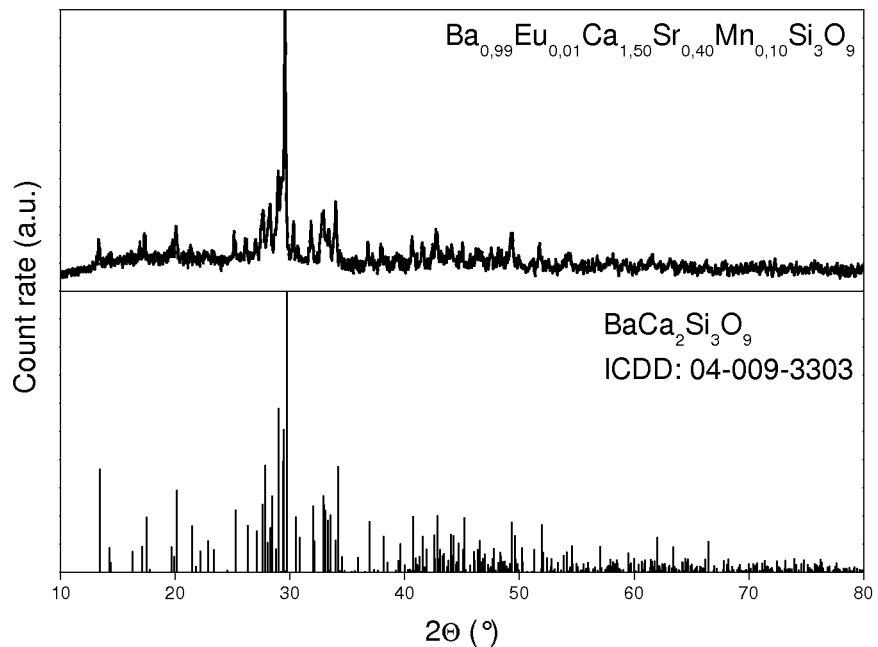
FIG. 15: X-ray powder diffraction pattern of $Ba_{0.99}Eu_{0.01}Ca_{1.50}Sr_{0.40}Mn_{0.10}Si_3O_9$ (top) and the reference card 04-009-3303 of $BaCaSi_3O_9$ (bottom).
Figure 16:
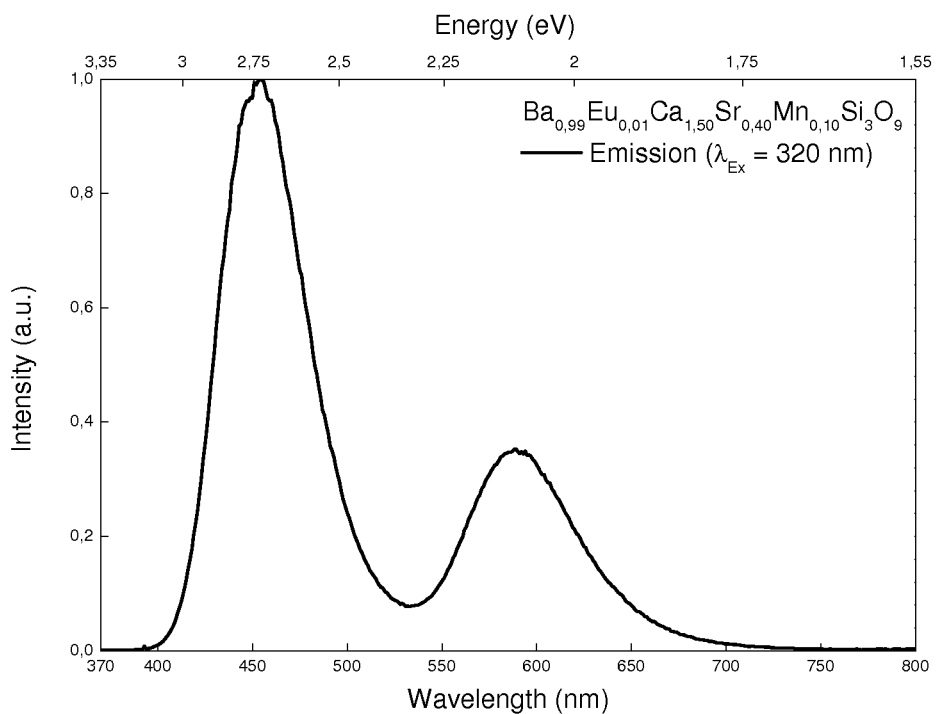
FIG. 16: Emission spectrum of $Ba_{0.99}Eu_{0.01}Ca_{1.50}Sr_{0.40}Mn_{0.10}Si_3O_9$ ($\lambda_{ex}$=320 nm).
Figure 17:
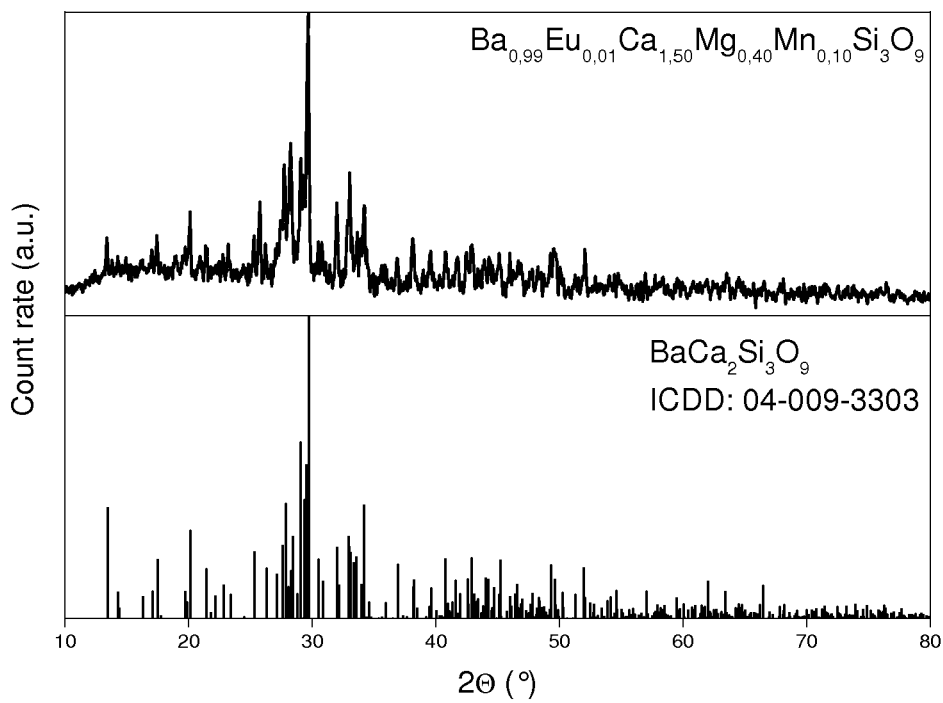
FIG. 17: X-ray powder diffraction pattern of $Ba_{0.99}Eu_{0.01}Ca_{1.50}Mg_{0.40}Mn_{0.10}Si_3O_9$ (top) and the reference card 04-009-3303 of $BaCaSi_3O_9$ (bottom).
Figure 18:
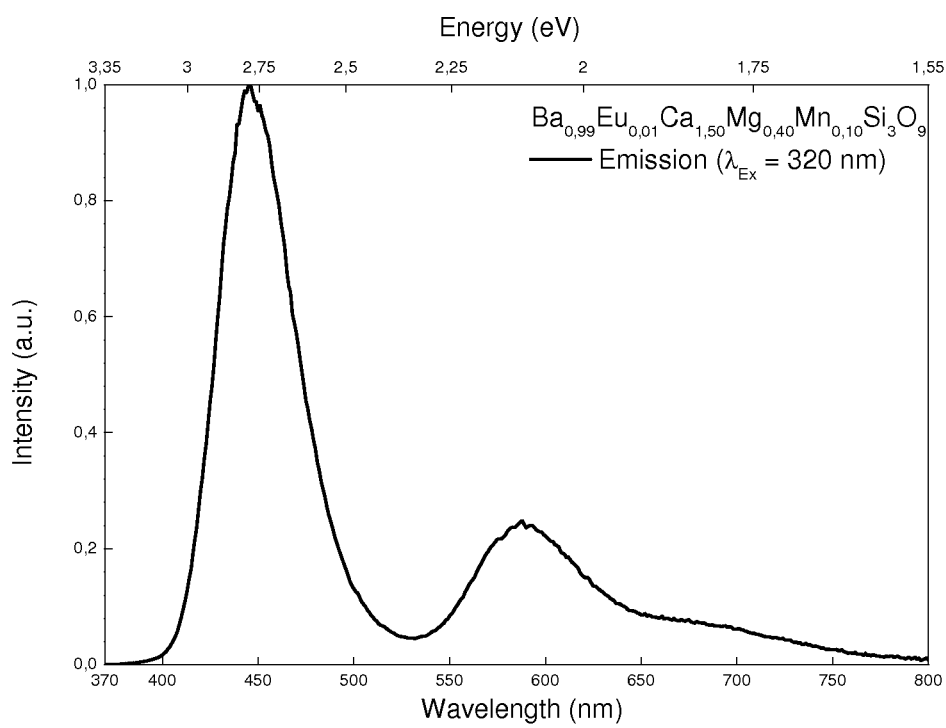
FIG. 18: Emission spectrum of $Ba_{0.99}Eu_{0.01}Ca_{1.50}Mg_{0.40}Mn_{0.10}Si_3O_9$ ($\lambda_{ex}$=320 nm).
Figure 19:
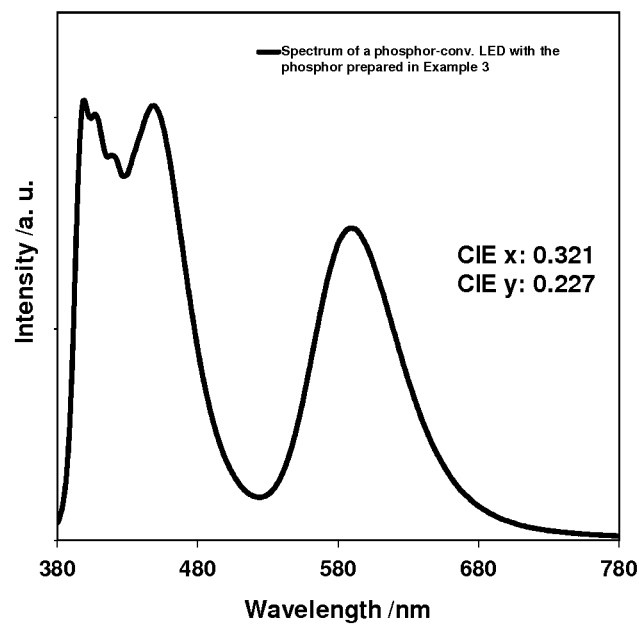
FIG. 19: Spectrum of the phosphor-converted LED described in Example 4.
Figure 20:
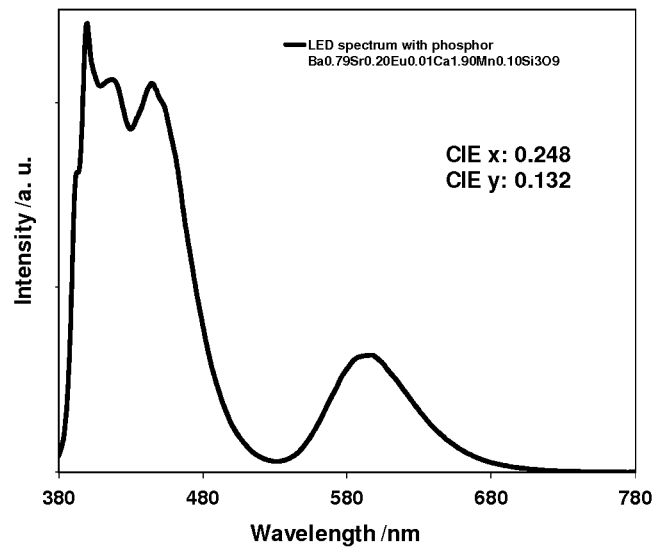
FIG. 20: Spectrum of the phosphor-converted LED described in Example 5.
Figure 21:
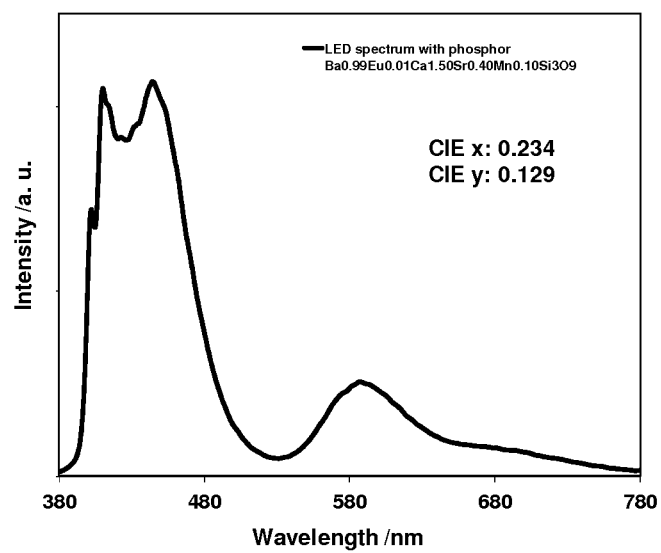
FIG. 21: Spectrum of the phosphor-converted LED described in Example 6.

The invention claimed is:

1. Compound of the formula (1), $$(EA^1)_{1-x}(EA^2)_{2-y}Si_3O_9:Eu_x, Mn_y \quad (1)$$

where the following applies to the symbols and indices used:
$EA^1$ is Ba or a mixture of Ba and Sr which comprises up to 20 atom-% of Sr;
$EA^2$ is selected from the group consisting of Ca or Sr or mixtures of these elements, where up to 20 atom-% of these elements may be replaced by Mg;
$0.01 \leq x \leq 0.25$;
$0.01 < y \leq 0.20$.

2. Compound according to claim 1, wherein $EA^1$ is selected from Ba or a mixture of Ba and Sr which comprises a maximum of 10 atom-% of Sr.

3. Compound according to claim 1, wherein $EA^2$ is selected from Ca or Sr or a mixture of Ca and Sr or a mixture of Ca and Mg which comprises a maximum of 20 atom-% of Mg or a mixture of Sr and Mg which comprises a maximum of 20 atom-% of Mg.

4. Compound according to claim 1, selected from the compounds of the formulae (2) to (4), $$(Ba_{1-z}Sr_z)_{1-x}(Ca_{1-w}Sr_w)_{2-y}Si_3O_9:Eu_x, Mn_y \quad (2)$$

$$(Ba_{1-z}Sr_z)_{1-x}(Ca_{1-v}Mg_v)_{2-y}Si_3O_9:Eu_x, Mn_y \quad (3)$$

$$(Ba_{1-z}Sr_z)_{1-x}(Sr_{1-v}Mg_v)_{2-y}Si_3O_9:Eu_x, Mn_y \quad (4)$$

where the indices x and y have the meanings given in claim 1 and the following applies to the other indices used:
$0 \leq z \leq 0.20$;
$0 \leq w \leq 1$;
$0 \leq v \leq 0.20$.

5. Compound according to claim 1, selected from the compounds of the formulae (2a) to (2c), (3a) and (4a), $$Ba_{1-x}Ca_{2-y}Si_3O_9:Eu_x, Mn_y \quad (2a)$$

$$Ba_{1-x}Sr_{2-y}Si_3O_9:Eu_x, Mn_y \quad (2b)$$

$$Ba_{1-x}(Ca_{1-w}Sr_w)_{2-y}Si_3O_9:Eu_x, Mn_y \quad (2c)$$

$$Ba_{1-x}(Ca_{1-v}Mg_v)_{2-y}Si_3O_9:Eu_x, Mn_y \quad (3a)$$

$$Ba_{1-x}(Sr_{1-v}Mg_v)_{2-y}Si_3O_9:Eu_x, Mn_y \quad (4a)$$

where the indices x and y have the meanings given in claim 1 and the following applies to the other indices used:
$0 \leq w \leq 1$;
$0 \leq v \leq 0.20$.

6. Compound according to claim 1, wherein the following applies to the index x: $0.05 \leq x \leq 0.15$.

7. Compound according to claim 1, wherein the following applies to the index y: $0.05 \leq y \leq 0.15$.

8. Process for the preparation of a compound according to claim 1, comprising the steps:
a) preparation of a mixture comprising $EA^1$, $EA^2$, Eu, Mn and Si; and
b) calcination of the mixture at elevated temperature.

9. Compound according to claim 1, wherein the compound is coated on the surface with another compound selected from metal oxides and metal nitrides.

10. A method for the partial or complete conversion of near-UV emission into light having a longer wavelength, comprising applying the emission to a compound according to claim 1.

11. Emission-converting material comprising a compound according to claim 1 and one or more further conversion phosphors.

12. Emission-converting material according to claim 11, wherein the further conversion phosphor is selected from the group consisting of $Lu_3(Al_{1-x}Ga_x)_5O_{12}$:Ce, $LiTb(Mo_{1-x}W_x)_2O_8$, $Tb_2(Mo_{1-x}W_x)O_6$, $Tb_2(Mo_{1-x}W_x)_2O_9$, $Tb_2(Mo_{1-x}W_x)_3O_{12}$, $Tb_2(Mo_{1-x}W_x)_4O_{15}$, $(Ba_{1-x}Sr_x)_2SiO_4$:Eu, $(Ba_{1-x}Sr_x)_2SiO_5$:Eu, $(Y,Gd)BO_3$:CeTb, $Y_2SiO_5$:CeTb, $Y_2Si_2O_7$:Ce,Tb, $Ca_3Y_2[Si_3O_9]_2$:CeTb, [Tb(benzoate)$_3$], [Tb(picolinate)$_3$], [Tb(aminophenolate)$_3$] and Tb[N(CN)$_2$]$_3$, where x adopts a value between 0 and 1, wherein, (Y,Gd) in the formula (Y,Gd)BO$_3$:CeTb means the presence of Y or Gd in the alternative or a mixture of Y and Gd in any ratio to meet the valency indicated by the formula.

13. Light source comprising at least one primary light source and at least one compound according to claim 1.

14. Lighting unit comprising at least one light source according to claim 13.

15. Ceramic comprising at least one compound according to claim 1.

16. Light source comprising at least one primary light source and an emission-converting material of claim 11.

17. Ceramic comprising at least one emission-converting material of claim 11.

18. Compound according to claim 1, wherein $EA^1$ is Ba.

* * * * *